United States Patent
Mine et al.

(10) Patent No.: US 7,115,943 B2
(45) Date of Patent: Oct. 3, 2006

(54) NONVOLATILE SEMICONDUCTOR MEMORY DEVICE AND MANUFACTURING METHOD THEREOF

(75) Inventors: Toshiyuki Mine, Fussa (JP); Natsuki Yokoyama, Mitaka (JP); Kan Yasui, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/013,406

(22) Filed: Dec. 17, 2004

(65) Prior Publication Data

US 2005/0199940 A1  Sep. 15, 2005

(30) Foreign Application Priority Data

Mar. 10, 2004  (JP) ............... 2004-066767

(51) Int. Cl.
*H01L 29/792* (2006.01)
(52) U.S. Cl. .................... 257/324; 257/326
(58) Field of Classification Search ............. 257/316, 257/321, 324, 326; 438/216, 261, 591, 593
See application file for complete search history.

(56) References Cited

U.S. PATENT DOCUMENTS 5,408,115 A * 4/1995 Chang .................. 257/324
5,969,383 A  10/1999 Chang et al.
6,642,586 B1  11/2003 Takahashi

FOREIGN PATENT DOCUMENTS

JP  2003-046002  7/2001

* cited by examiner

*Primary Examiner*—Thien F. Tran
(74) *Attorney, Agent, or Firm*—Reed Smith LLP; Stanley P. Fisher, Esq.; Juan Carlos A. Marquez, Esq.

(57) ABSTRACT

A MONOS nonvolatile memory of a split gate structure, wherein writing and erasing are performed by hot electrons and hot holes respectively, is prone to cause electrons not to be erased and to remain in an Si nitride film on a select gate electrode sidewall and that results in the deterioration of rewriting durability. When long time erasing is applied as a measure to solve the problem, drawbacks appear, such as the increase of a circuit area caused by the increase of the erasing current and the deterioration of retention characteristics. In the present invention, an Si nitride film is formed by the reactive plasma sputter deposition method that enables oriented deposition and the Si nitride film on a select gate electrode sidewall is removed at the time when a top Si oxide film is formed.

7 Claims, 23 Drawing Sheets

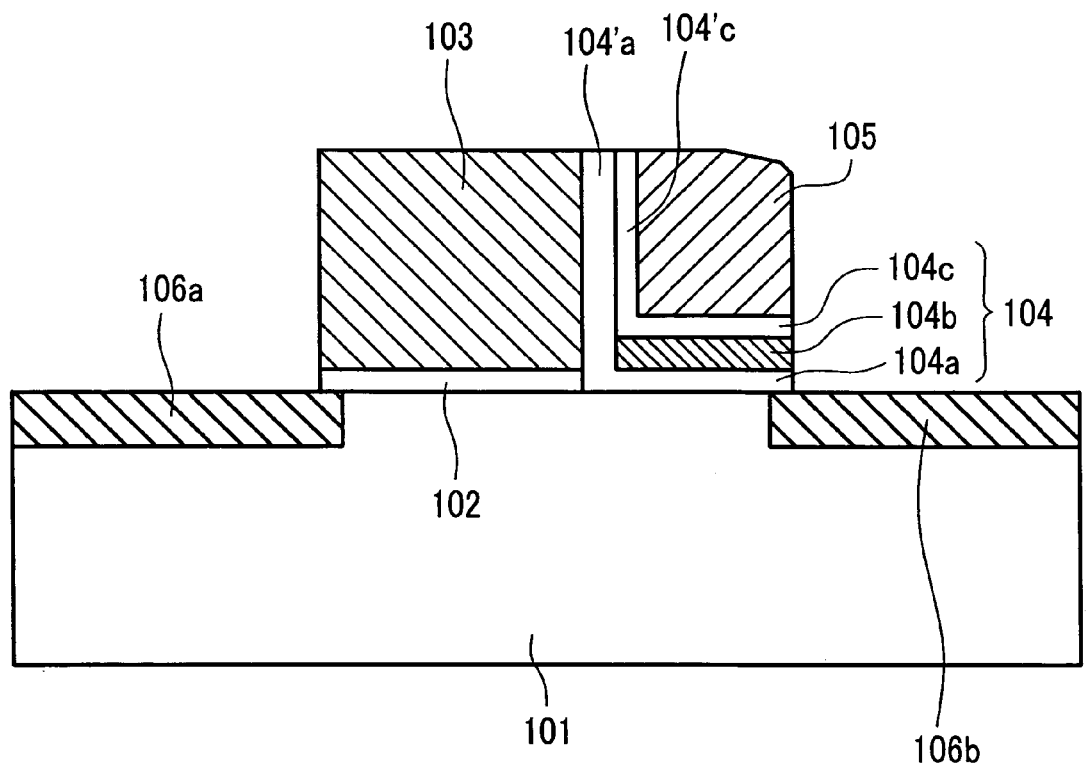
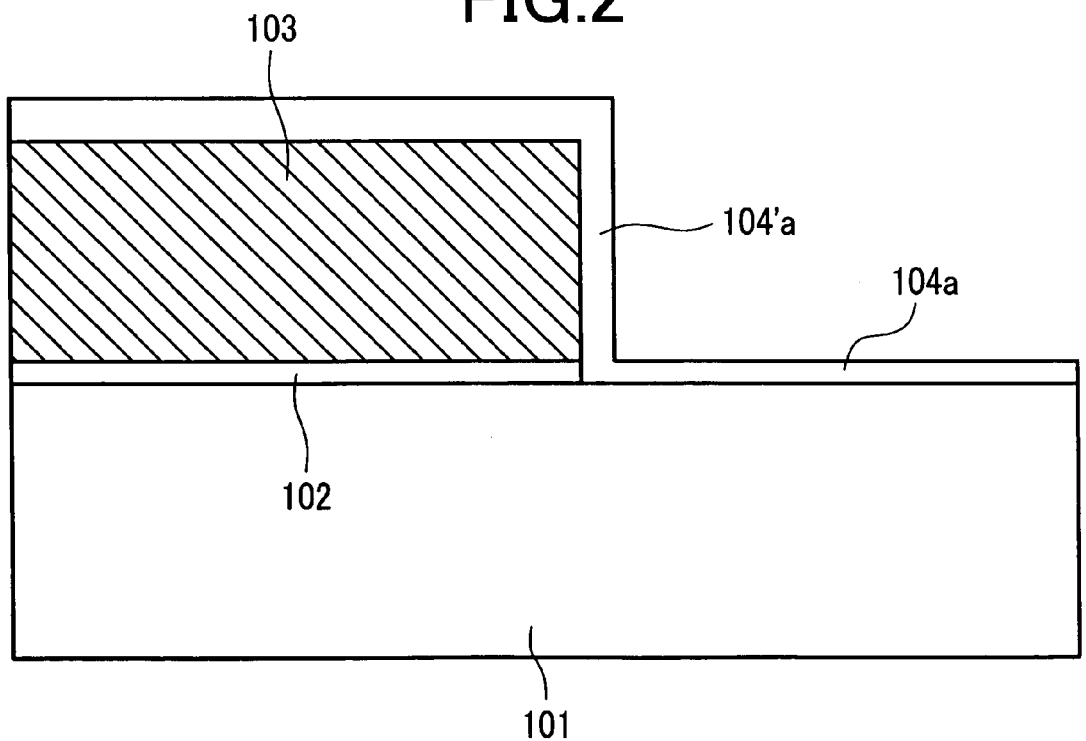

| OPERATION VOLTAGE | Vsg | Vmg | Vd | Vs | Vwell | METHOD |
|---|---|---|---|---|---|---|
| WRITE (INJECTION) | 1.5V | 11V | 6V | 0.8V | 0V | SOURCE SIDE HOT-ELECTRON INJECTION |
| ERASE (RELEASE) | 0V | -5V | 7V | OPEN | 0V | DRAIN SIDE HOT-HOLE INJECTION |
| READ | 1.5V | 1.5V | 0V | 1.0V | 0V | REVERSE READING OPERATION | ptOCR-no-image

NONVOLATILE SEMICONDUCTOR MEMORY DEVICE AND MANUFACTURING METHOD THEREOF

CLAIM OF PRIORITY

The present application claims priority from Japanese application JP 2004-066767 filed on Mar. 10, 2004, the content of which is hereby incorporated by reference into this application.

FIELD OF THE INVENTION

The present invention relates to the structure of a nonvolatile semiconductor memory device and its manufacturing method, in particular to a highly reliable nonvolatile semiconductor memory device capable of low voltage operation and high-speed programming and its manufacturing method.

BACKGROUND OF THE INVENTION

It becomes possible to realize a highly functional semiconductor device by consolidating a nonvolatile semiconductor memory cell with a logic semiconductor device on the same silicon (Si) substrate. Such highly functional semiconductor devices are widely used as built-in microcomputers for industrial machines, home appliances, vehicle-installed devices, and others.

A consolidated nonvolatile memory is generally used by storing and retrieving programs required by a microcomputer as needed. As such a nonvolatile memory as to have a cell structure suitable for being consolidated with a logic semiconductor device, there is a memory cell having a split gate structure and comprising a select MOS transistor and a memory MOS transistor.

As methods for retaining electric charge in a memory MOS transistor which is prevailing in consolidated use since the area of peripheral circuitry for the control of memory can be reduced by the adoption of such a structure, there are the floating gate method wherein electric charge is stored in electrically conductive polycrystalline silicon isolated electrically and the MONOS method wherein electric charge is stored in an insulator film, such as an Si nitride film, having the function of storing electric charge.

Either of such electric charge retaining methods is configured so that the region where electric charge is stored is covered by an Si oxide film excellent in electrical isolation. However, the MONOS method has some advantages that: it allows discrete storage since electric charge is stored in an insulator film; it facilitates prediction of reliability since it does not see the radical shortening of charge retention time caused by defects of an Si oxide film; and it has a simple memory cell structure and therefore it is easily consolidated with logic gates. In addition, since the MONOS method does not see the radical shortening of charge retention time caused by defects of an Si oxide film, hot-hole erasure which is likely to cause damage to an Si oxide film can be adopted, thus erasing time can be shortened by leaps and bounds, and resultantly the MONOS method gathers attention in recent years. Here, hot-hole erasure is described later in detail but briefly it is the method for erasing hot electrons stored in an Si insulator film as recorded information by inducing hot holes in a memory cell and neutralizing and erasing the electrons as the stored information.

As a split gate structure particularly suitable for miniaturization, there is a structure wherein a memory MOS transistor is formed with a sidewall by utilizing self-alignment (hereunder referred to as "self-aligned split gate structure"), (for example, refer to Patent documents 1 to 3).

In the case of a MONOS memory adopting such a self-aligned split gate structure, the gate length of a memory MOS transistor can be smaller than the minimum resolution size of lithography and therefore it has the advantages that operation current can be increased (operation frequency increases) and the area of a memory cell can largely be fractionized. The structure and operation of a conventional MONOS memory cell are hereunder explained briefly on the basis of FIG. 15.

Such a nonvolatile memory is composed of two MOS transistors; a memory MOS transistor $Q_1$ that composes a storage node and a select MOS transistor $Q_2$ that selects the storage node and retrieves information. The diffusion layer (source region) 406a of the select MOS transistor $Q_2$ is connected to a common source line and a select gate electrode 403 is connected to a word line. Meanwhile, the diffusion layer (drain region) 406b of the memory MOS transistor $Q_1$ is connected to a bit line and a memory gate electrode 405 is connected to a memory gate line.

The gate insulator film 404 of the memory MOS transistor $Q_1$ is composed of a film of a three-layered structure; for example, from the surface of an Si substrate 401 in order, an Si oxide film (the first-layered film) 404a, an Si nitride film (the second-layered film) 404b and another Si oxide film (the third-layered film) 404c.

With regard to the thickness of the gate insulator film, each of the first-layered film 404a, second-layered film 404b and third-layered film 404c is about 5 to 15 nm.

The gate insulator film 404 of the memory MOS transistor $Q_1$ is formed after the gate electrode 403 of the select MOS transistor $Q_2$ is formed and therefore it is formed also on the sidewall of the select gate electrode 403.

The thermal oxidation method is used for the formation of the first-layered Si oxide film 404a. The low-pressure thermal CVD method which is excellent in step coverage is used for the formation of the second-layered Si nitride film 404b, and the method of using dichlorosilane ($SiH_2Cl_2$) and ammonia ($NH_3$) as the material gas is generally employed. For the formation of the third-layered Si oxide film 404c, either of the thermal oxidation method and the low-pressure thermal CVD method is commonly used and, generally speaking, the thermal oxidation method is dominantly used.

Writing operation is carried out by: applying prescribed voltages to the diffusion layer (source region) 406a and gate electrode 403 of the select MOS transistor $Q_2$ and thus activating the select MOS transistor $Q_2$; and simultaneously applying prescribed voltages to the diffusion layer (drain region) 406b and gate electrode 405 of the memory MOS transistor $Q_1$. For example, the voltages of 0 V, 1 to 2 V, 3 to 5 V and a high voltage of 8 to 10 V are applied to the source region 406a, the gate electrode 403 of the select MOS transistor $Q_2$, the drain region 406b and the gate electrode 405 of the memory MOS transistor $Q_1$, respectively.

Under such voltage conditions, a high electric field is imposed on the boundary region between the select MOS transistor $Q_2$ and the memory MOS transistor $Q_1$, and resultantly hot electrons of large energy are generated in the Si substrate 401. Some of the hot electrons are injected to the side of the memory gate electrode 405 to which a high voltage is applied. At the time, most of the hot electrons are trapped in the Si nitride film 404b that constitutes a part of the gate insulator film of the memory MOS transistor $Q_1$.

Such an electron injection method is generally called the source side hot-electron injection method or the source side injection method.

Erasing operation is carried out by the method of: applying a negative bias to the memory gate electrode 405 of the memory MOS transistor $Q_1$ and a positive bias to the diffusion layer 406b (drain region); generating hot holes by using band-to-band tunneling (BTBT); and injecting the hot holes into the Si nitride film 404b (hot-hole erasing). For example, erasing is carried out by applying 5 to 7 V to the drain region 406b, −9 to −11 V to the gate electrode 405 of the memory MOS transistor $Q_1$, and 0 V or no voltage application to the source region 406a and the gate electrode 403 of the select MOS transistor $Q_2$.

Retrieving operation is carried out by retrieving recorded information in compliance with whether a prescribed current is fed or not in accordance with the state of the threshold voltage of the memory MOS transistor $Q_1$ when the select MOS transistor $Q_2$ is activated.

[Patent document 1] JP-A No. 74389/1999
[Patent document 2] JP-A No. 46002/2003
[Patent document 3] JP-A No. 237540/2002

The problems of the MONOS memory of a split gate structure shown in FIG. 15 are explained on the basis of figures. FIGS. 16 and 17 are views obtained by enlarging the region A of FIG. 15.

As described above, the region where hot electrons are generated in the Si substrate 401 at the time of writing is located underneath the vicinity of the region where the select gate electrode 403 of the select MOS transistor $Q_2$ and the memory gate electrode 405 of the memory MOS transistor $Q_1$ are electrically separated. Some of the hot electrons generated from the position are injected toward the edge of the gate electrode 405 by the gate electric field of the memory MOS transistor $Q_1$. Most of the injected hot electrons are trapped in the Si nitride film 404b having a large trapping sectional area and resultantly writing is carried out.

As shown in FIG. 16, in the event of the aforementioned writing, hot electrons are injected in the direction of the arrow while extending laterally and therefore some of the hot electrons are injected also into the sidewall region of the gate electrode 403 of the select MOS transistor $Q_2$, in other words, the vertical region of the L-shaped Si nitride film 404b (the direction perpendicular to the Si substrate). Further, it is estimated that the distribution of the trapped electrons further expands by the influences of: the internal electric field in the Si nitride film 404b caused by the trapped electrons; and a high temperature environment of about 150° C.

Meanwhile, in the event of the injection of hot holes for erasing, hot holes are injected in the direction of the arrow from one end of the drain 406b of the memory MOS transistor $Q_1$ as shown in FIG. 17. The hot holes generated in the high electric field region at the end of the drain 406b are injected into the Si nitride film 404b while being influenced by the electric field of the memory gate electrode 405 and slightly expanding toward the side of the select MOS transistor $Q_2$.

The extension of the hot-hole injection in the lateral direction depends on injection conditions and is estimated to be 50 to 80 nm. As shown in FIG. 17, electrons existing in the region into which positive holes are injected are erased in microseconds, but the electrons existing outside the positive hole injected region has a very small positive hole density and therefore some electrons are unerased and remain. The amount of unerased electrons increases as the frequency of rewriting increases, and therefore the drawback here is that a prescribed threshold voltage cannot be secured even though erasing of electrons is carried out for the last time.

In order to avoid unerased electrons from remaining, it is necessary either to further shorten the gate length (Lmg) of the memory MOS transistor $Q_1$ or to prolong the erasing time considerably. However, if Lmg is shortened, punch through occurs. For that reason, the lower limit of Lmg is about 60 nm.

In contrast, if the hot-hole injection time is prolonged, the following harmful effects appear: (1) the area of the charge pump power supply circuit for securing supply current increases, (2) the bottom gate oxide film 404a deteriorates and the charge retention time decreases, and (3) positive holes accumulate in the Si nitride film 404b in the vicinity of the drain 406b and the generation efficiency of hot holes lowers.

SUMMARY OF THE INVENTION

In this light, the objects of the present invention are: to improve the performance of a MONOS nonvolatile memory of a split gate structure wherein a memory MOS transistor $Q_1$ is formed in self-aligned manner on the sidewall of the gate electrode of a select MOS transistor $Q_2$; particularly to reduce the number of unerased electrons and thus improve rewriting durability; further to reduce an erasing current by shortening erasing time and reduce the area of a power supply circuit; and furthermore to restrain the deterioration of a gate oxide film 404a by shortening erasing time and prevent an electric charge retention capability from deteriorating.

The outline of a nonvolatile semiconductor memory device according to the present invention that can attain the above objects is explained on the basis of figures. FIGS. 18, 19 and 20 are the views schematically showing the examples of the sectional configurations on the substantial parts of three kinds of nonvolatile semiconductor memory devices that represent the present invention.

Firstly, the example of the first configuration is explained on the basis of FIG. 18. That is, a nonvolatile semiconductor memory device of the first configuration according to the present invention is characterized by: having (a) a first semiconductor region (source) 506a and a second semiconductor region (drain) 506b formed in a semiconductor substrate 501, (b) a first electric conductor (select gate: SG) 503 and a second electric conductor (memory gate: MG) 505 formed on said semiconductor substrate 501 between said first semiconductor region 506a and said second semiconductor region 506b, (c) a first insulator film 502 formed between said first electric conductor 503 and said semiconductor substrate 501, (d) a three-layered second insulator film (an Si oxide film 504a, an Si nitride film 504b and another Si oxide film 504c) 504 formed between said second electric conductor 505 and said semiconductor substrate 501, and (e) a double-layered second insulator film (an Si oxide film 504a and another Si oxide film 504c) 504 formed between said first electric conductor 503 and said second electric conductor 505; and being-configured so that (f) said three-layered second insulator film 504 formed between said second electric conductor 505 and said semiconductor substrate 501 comprises a potential barrier film (Si oxide film) 504a formed on said semiconductor substrate 501, an Si nitride film 504b formed thereon, and another potential barrier film (Si oxide film) 504c formed further thereon, and (g) said double-layered second insulator film 504 formed between said first electric conductor (SG) 503 and said second electric conductor (MG) 505 comprises a potential barrier film (Si oxide film) 504a and another potential barrier film (Si oxide film) 504c formed thereon.

That is to say, a feature of the present invention is that said second insulator film 504 formed between said first electric conductor (SG) 503 and said second electric conductor (MG) 505 is composed of a double-layered structure comprising potential barrier films (Si oxide films) 504a and 504c.

A conventional second insulator film 504 in such a region has been composed of a three-layered structure formed by interposing a part of a charge trapping film (Si nitride film) 504b between double-layered potential barrier films (Si oxide films) 504a and 504c. In contrast, in the present invention, such a region is composed of a double-layered structure comprising potential barrier films (Si oxide films) 504a and 504c without the formation of a charge trapping film (Si nitride film) 504b.

Secondly, the example of the second configuration is explained on the basis of FIG. 19. That is, a nonvolatile semiconductor memory device of the second configuration according to the present invention is characterized by: having (a) a first semiconductor region (source) 606a and a second semiconductor region (drain) 606b formed in a semiconductor substrate 601, (b) a first electric conductor (select gate: SG) 603 and a second electric conductor (memory gate: MG) 605 formed on said semiconductor substrate 601 between said first semiconductor region 606a and said second semiconductor region 606b, (c) a first insulator film 602 formed between said first electric conductor 603 and said semiconductor substrate 601, and (d) a three-layered second insulator film (an Si oxide film 604a, Si nitride films 604b and 604'b, and another Si oxide film 604c) 604 formed between said second electric conductor 605 and said semiconductor substrate 601 and between said first electric conductor (SG) 603 and said second electric conductor (MG) 605; and being configured so that said second insulator film 604 formed between said second electric conductor 605 and said semiconductor substrate 601 comprises a potential barrier film (Si oxide film) 604a, an Si nitride film (charge trapping film) 604b formed thereon, and another potential barrier film (Si oxide film) 604c formed further thereon, and at least a part, on the side closer to the Si substrate 601, of the Si nitride film 604'b located on the sidewall of said first electric conductor (SG) 603 is cut off by the potential barrier film (Si oxide film) 604c located on said Si nitride film 604b.

Thirdly, the example of the third configuration is explained on the basis of FIG. 20. That is, a nonvolatile semiconductor memory device of the third configuration according to the present invention is characterized by: having (a) a first semiconductor region (source) 706a and a second semiconductor region (drain) 706b formed in a semiconductor substrate 701, (b) a first electric conductor (select gate: SG) 703 and a second electric conductor (memory gate: MG) 705 formed on said semiconductor substrate 701 between said first semiconductor region 706a and said second semiconductor region 706b, (c) a first insulator film 702 formed between said first electric conductor 703 and said semiconductor substrate 701, and (d) a three-layered second insulator film (an Si oxide film 704a, Si nitride films 704b and 704'b, and another Si oxide film 704c) 704 formed between said second electric conductor 705 and said semiconductor substrate 701 and between said first electric conductor (SG) 703 and said second electric conductor (MG) 705; and being configured so that said second insulator film 704 formed between said second electric conductor 705 and said semiconductor substrate 701 comprises a potential barrier film (Si oxide film) 704a, an Si nitride film (charge trapping film) 704b formed thereon, and another potential barrier film (Si oxide film) 704c formed further thereon, and the thickness of said Si nitride film 704'b located between said first electric conductor (SG) 703 and said second electric conductor (MG) 705 is thinner than that of said Si nitride film 704b located between said second electric conductor 705 and said semiconductor substrate 701.

That is to say, electrons injected into or diffused in the Si nitride film on the gate electrode sidewall of a select MOS transistor $Q_2$ are most likely to be unerased and remain in comparison with the electrons in other regions.

In this light, a feature of the third configuration is that the amount of electrons injected into or diffused in the Si nitride film on the gate electrode sidewall of a select MOS transistor $Q_2$ is controlled so as to be smaller than that of electrons in other regions, particularly in the Si nitride film (charge trapping film) constituting a part of the second insulator film between the second electric conductor (memory gate: MG) and the semiconductor substrate.

As the present invention is outlined on the basis of the examples of the three kinds of typical configurations in the above explanations, the essential point of the present invention is: to remove the entire Si nitride film on the select gate electrode sidewall as explained in the example of the first configuration (FIG. 18); to remove a part of the Si nitride film on the select gate electrode sidewall as explained in the example of the second configuration (FIG. 19); or to control the thickness of the Si nitride film on the select gate electrode sidewall so as to be thinner than that of the other region (between the memory gate MG and the semiconductor substrate) and to lessen the influence of the unerased and remaining electrons as explained in the example of the third configuration (FIG. 20).

By the present invention, it becomes possible to remarkably reduce the number of unerased electrons caused by hot-hole erasing and to improve rewriting durability.

Further, by the present invention, since the erasing time by hot holes is largely shortened, it is possible to reduce the erasing current required for erasing. By so doing, the area of a power supply circuit is reduced and the production cost is also reduced.

Furthermore, by the present invention, since the erasing time is largely shortened, it is possible to restrain the deterioration of the lower layer potential barrier film (bottom Si oxide film) accompanying erasing. By so doing, the electric charge retention capability improves.

As a result of combining all above effects, the present invention makes it possible to realize a MONOS nonvolatile memory of a split gate structure excellent in rewriting durability and an electric charge retention capability at a low cost.

BRIEF DESCRIPTION OF THE DRAWINGS

FIG. 1 is a sectional view showing the substantial part of a memory cell of a split gate structure representing the first embodiment according to the present invention;

FIG. 2 is a sectional view of a cell showing a production process in the first embodiment according to the present invention;

DETAILED DESCRIPTION OF THE PREFERRED EMBODIMENTS

Details of embodiments according to the present invention are hereunder explained on the basis of drawings.

Figures 7, 8:
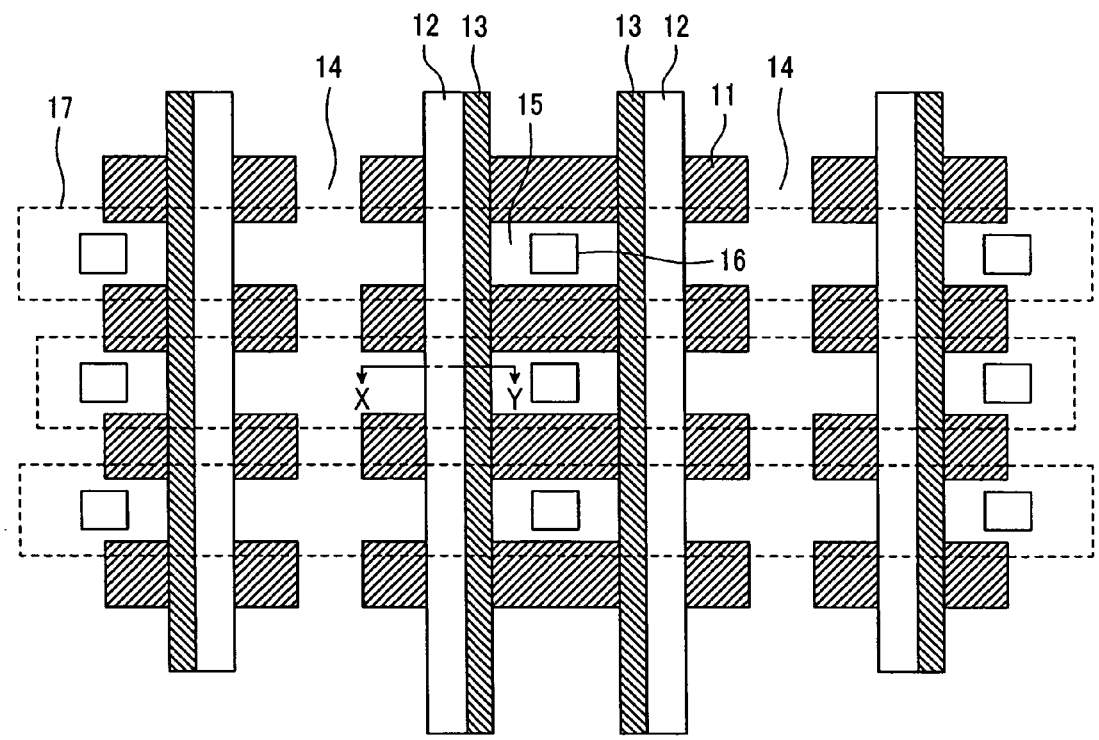
FIG. 7 is a view showing the layout of memory array in an embodiment according to the present invention.
FIG. 8 is a table showing the setup of operation voltages in an embodiment according to the present invention.

Firstly, the configuration of a memory array which is common in the present invention is shown in FIG. 7. Each memory cell is isolated from other memory cells by a shallow trench isolation region (STI) 11, a common source line 14 is connected to memory cells, a word line 12 acting as the select gate electrode of a MONOS nonvolatile memory and the gate line 13 of a memory MOS transistor are disposed in parallel with the source line 14, and a drain 15 is formed at the place opposite the source region 14 interposing the gate lines 12 and 13 in between. The reference numeral 16 in the figure is an opening to connect a bit line 17 to the drain 15. The bit line 17 is disposed via an interlayer insulating film which is not shown in the figure so as to intersect with the word line 12 at right angles.

Embodiments

Figure 18:
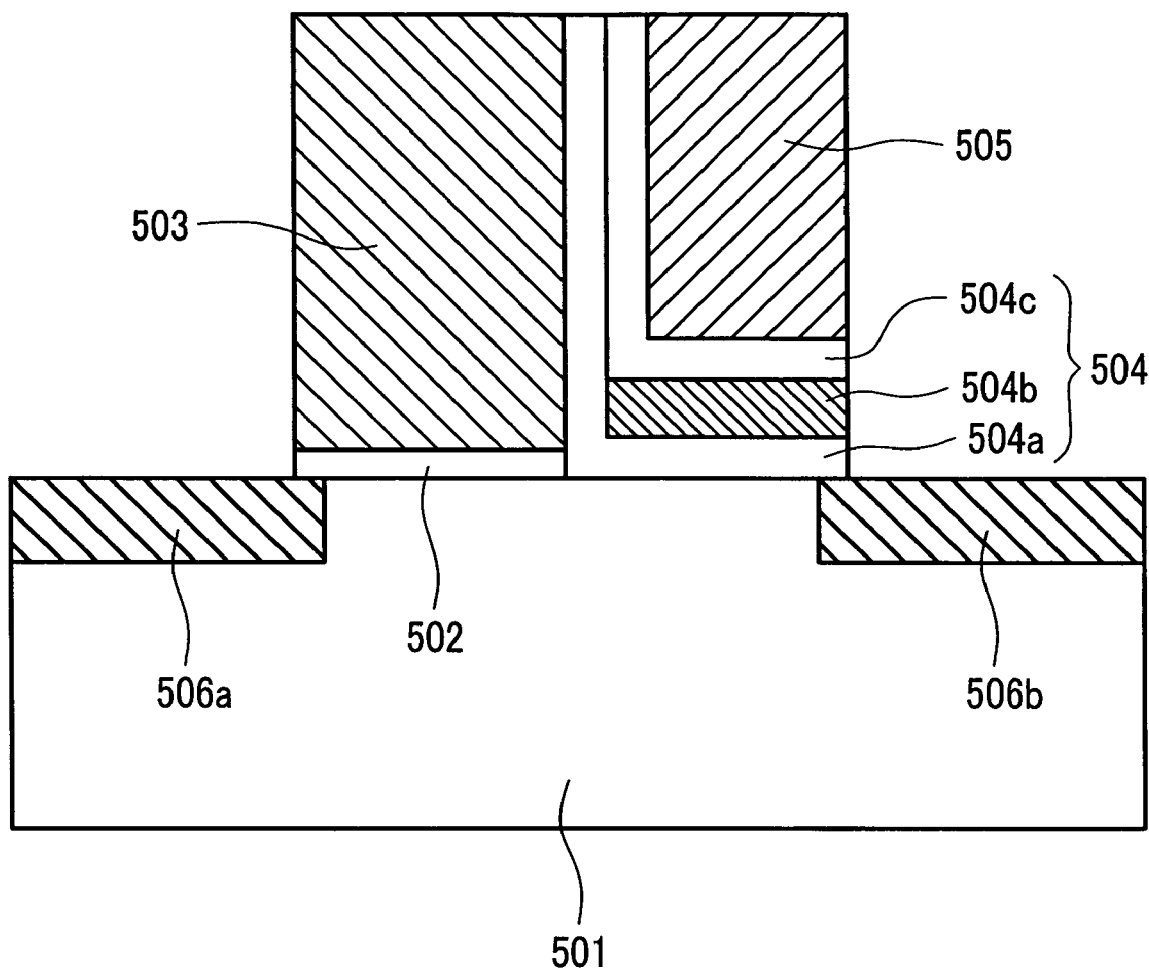
FIG. 18 is a sectional view of a cell explaining an example of the first split gate structure according to the present invention.

Next, the example of the first configuration explained earlier in FIG. 18 is explained concretely on the basis of the first and second embodiments, the example of the second configuration explained earlier in FIG. 19 on the basis of the third embodiment, and the example of the third configuration explained earlier in FIG. 20 on the basis of the fourth embodiment.

First Embodiment

FIG. 1 is a sectional view of the first embodiment according to the present invention and corresponds to a sectional view taken on line X-Y of FIG. 7. The bit line 17 is expressed in FIG. 7 but not in FIG. 1.

The MONOS memory cell of a split gate structure produced in the present embodiment is composed of: a p-type well region (Si substrate) 101 formed on an Si substrate (semiconductor substrate); and two MOS transistors $Q_1$ and $Q_2$ having an n-type diffusion layer (n-type semiconductor region) acting as a source region 106a and another n-type diffusion layer acting as a drain region 106b, respectively.

The select MOS transistor $Q_2$ is composed of an Si oxide film acting as a gate insulator film 102 and an n-type polycrystalline silicon film (hereunder referred to as "Si film") acting as a select gate electrode (electric conductor) 103.

The memory MOS transistor $Q_1$ is composed of: an Si oxide film acting as a lower layer potential barrier film 104a isolating the p-type well region (Si substrate) 101; an Si nitride film acting as a charge trapping film 104b; another Si oxide film acting as an upper layer potential barrier film 104c isolating a memory gate electrode 105; and an n-type polycrystalline Si film acting as the memory gate electrode 105. As shown in the figure, the memory MOS transistor $Q_1$ is formed in a self-aligned manner relative to the select MOS transistor $Q_2$. Here, the reference numeral 104'a in FIG. 1 is a lower layer potential barrier film (Si oxide film) on the select gate electrode sidewall of the select MOS transistor $Q_2$ and 104'c is an upper layer potential barrier film (Si oxide film) on the select gate electrode sidewall.

Next, the voltages at writing, erasing and retrieving operations in the present embodiment are shown in FIG. 8. The names of the applied voltages shown in FIG. 8 are commonly designated in the present embodiment and the voltages applied to the gate electrodes 203 and 205 of the select MOS transistor $Q_2$ and the memory MOS transistor $Q_1$ are shown by Vsg and Vmg, respectively. Further, the voltages of the drain and the source are shown by Vd and Vs, respectively. Furthermore, the case where the magnitude relation in the potential between the source and the drain is the same as the potential relation at the time of writing is defined as forward reading operation and the case where the relations are inverted is defined as reverse reading operation. Here, Vwell means a well voltage and is a voltage applied to the Si substrate 101 in the present embodiment. In addition, the values in the voltage conditions shown in FIG. 8 are only examples and the present invention is not limited to the values.

The details of the production method in the present embodiment are hereunder described on the basis of FIGS. 1 to 6.

Firstly, as shown in the sectional view of FIG. 2, a shallow trench element isolation region that is not shown in the figure was formed on an Si substrate 101 by a known technology. The shallow trench element isolation region corresponds to the reference numeral 11 shown in FIG. 7.

Next, an Si oxide film 102 3.5 nm in thickness acting as the gate insulator film 102 of a select MOS transistor $Q_2$ was formed by the thermal oxidation method and thereafter it was subjected to NO oxynitride treatment for 10 min. at 900° C. in an atmosphere of nitrogen monoxide (NO) diluted into 10% by nitrogen gas. By the application of the NO oxynitride treatment, nitrogen is introduced to the interface of the Si substrate 101 by about 3% and the reliability as a select gate insulator film 102 improves. Though the NO oxynitride treatment was applied with the aim of improving the reliability of a select gate insulator film 102 in the present embodiment, the same effect can be obtained even when oxynitride treatment is applied by using nitrous oxide ($N_2O$) instead of nitrogen monoxide (NO) and nitrogen is introduced to the interface of the Si substrate 101.

Next, a phosphor-doped polycrystalline Si film 103 acting as a select gate electrode 103 was deposited by 200 nm by the chemical vapor deposition (CVD) method and thereafter it was processed to form a prescribed electrode pattern by the known lithography and dry etching methods. Here, the concentration of the phosphor in the phosphor-doped polycrystalline Si film 103 was adjusted to 4e20 atms/cm$^3$. Successively, the part of the gate insulator film 102 other than the part thereof covered by the polycrystalline Si film pattern 103 was removed by dilute hydrofluoric acid aqueous solution and the surface of the Si substrate 101 was exposed. Thereafter, thermal oxide films 104a and 104'a were formed on the surface of the Si substrate 101 and the surface of the phosphor-doped polycrystalline Si film pattern 103 by the thermal oxidation method. As shown in FIG. 2, the thermal oxide film 104'a on the surface of the phosphor-doped polycrystalline Si film pattern 103 was formed so that the thickness thereof was thicker than that of the thermal oxide film 104a on the surface of the single crystal Si substrate 101. The phenomenon is caused by the difference of the concentration of impurities (phosphor) in Si. However, the thickness difference of the thermal oxide films can arbitrarily be determined by adjusting the concentrations of oxygen and moisture and an oxidation temperature in a thermal oxidation atmosphere.

In the present invention, the thicknesses of the thermal oxide films on the Si substrate 101 and the surface of the phosphor-doped polycrystalline Si film pattern 103 were set at 5 and 13 nm, respectively. The thermal oxide film 104a 5 nm in thickness formed on the Si substrate 101 acts as the lower layer potential barrier film 104a (hereunder referred to as "bottom Si oxide film) of the memory MOS transistor $Q_1$ shown in FIG. 1. Here, the thicknesses of the Si oxide films 104a and 104'a described here are only the examples and the present invention is not limited to those values.

Figure 3:
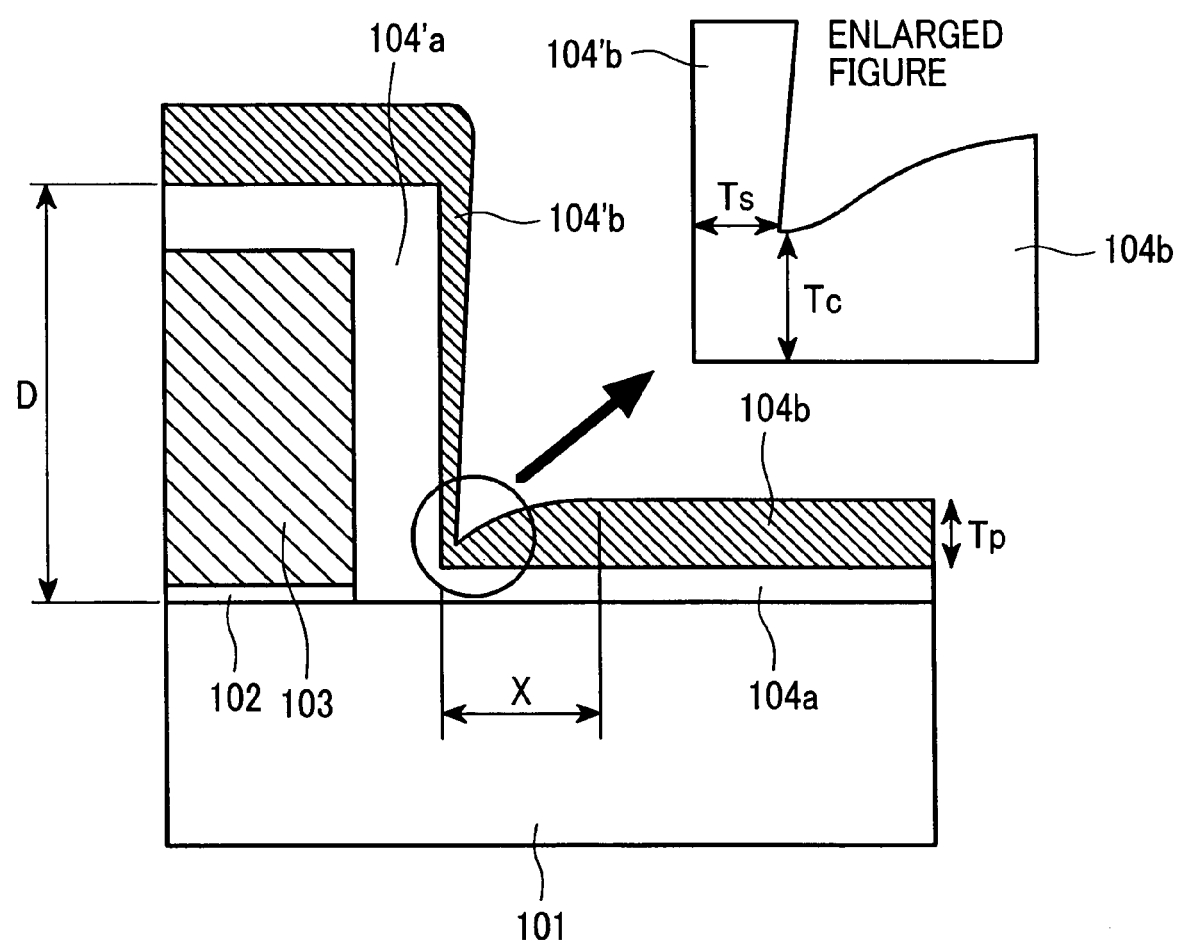
FIG. 3 is a sectional view of a cell showing another production process in the first embodiment according to the present invention.

Next, the method for forming an Si nitride film 104b acting as the charge trapping film 104b of the memory MOS transistor shown in FIG. 1 is explained on the basis of FIG. 3. In the present invention, the reactive sputter deposition method was applied to the formation of an Si nitride film 104b. In FIG. 3, an enlarged partial view in the vicinity of the sidewall bottom of the phosphor-doped polycrystalline Si film pattern 103 is also shown as indicated with the arrow. As it is already known, when applying the parallel-plane-type reactive sputter deposition method is applied to Si, it becomes possible to deposit an Si nitride film of a high quality by adjusting the ratio of the flow rates of nitrogen and a dilute gas (argon gas or the like) and the electric power of electrodes.

As shown in the enlarged partial view of FIG. 3, in general, the step coverage capability of a thin film formed by the reactive sputter deposition method is very poor and the thickness Ts of the Si nitride film 104'b on the vertical sidewall and the film thickness Tc of the sidewall bottom are thinner than the film thickness Tp at the flat portion located sufficiently far from the step. The thickness of the Si nitride film at the pattern step bottom changes in proportion to the distance from the pattern step edge and, as shown in the figure, the thickness Tc of the Si nitride film at the pattern step edge is the thinnest and the thickness thereof becomes Tp at the portion more than distance X apart from the pattern step edge.

Here, when step coverage is expressed by Rsp and Rcp and defined by Rsp=Ts/Tp and Rcp=Tc/Tp, respectively, Rsp, Rcp and X depend on the sputter conditions and the height of the pattern step (corresponds to D in the figure), wherein 0<Rsp<1 and 0<Rcp<1.

When an Si nitride film is formed by the reactive sputter deposition method, by the long-throw sputter deposition method (to align the orientation of ions by extending the distance between a target and an Si substrate) that emphasizes the orientation of the vertical component of ions, the collimated sputter deposition method (to align the orientation of ions by using a collimator), the dual-frequency sputter deposition method (to align the orientation of ions by applying low frequency voltage to an Si substrate side) or the like for example, the values of Rsp and X decrease and the value of Rcp increases. Meanwhile, if the sputter conditions are identical, as a pattern step D increases, the values of Psp and Rcp decrease and the value of X increases. Therefore, arbitrary values of Rsp, Rcp and X can be obtained by adjusting a sputter deposition method, sputter conditions and a pattern step D.

In the present embodiment, the collimated sputter deposition method wherein a collimator having a large aspect ratio was used was applied to the formation of an Si nitride film 104b and the thickness Tp of the Si nitride film 104b at the flat portion was set at 12 nm. At the time, the thicknesses Ts and Tc of the Si nitride film 104'b at the sidewall edge of the phosphor-doped polycrystalline Si film pattern 103 were about 2.2 and 6 nm respectively and the value of X was about 20 nm. Here, the values of Ts, Tc, Tp and X are only examples and that does not mean that the present invention is limited to those values. Note that, in the present embodiment, though the collimated sputter deposition method was used for the formation of the Si nitride film, as a matter of course, it is also possible to employ any of the aforementioned other sputter deposition methods, the electron-cyclotron-resonance sputter deposition method (ECR sputter deposition method) and the like.

Figure 4:
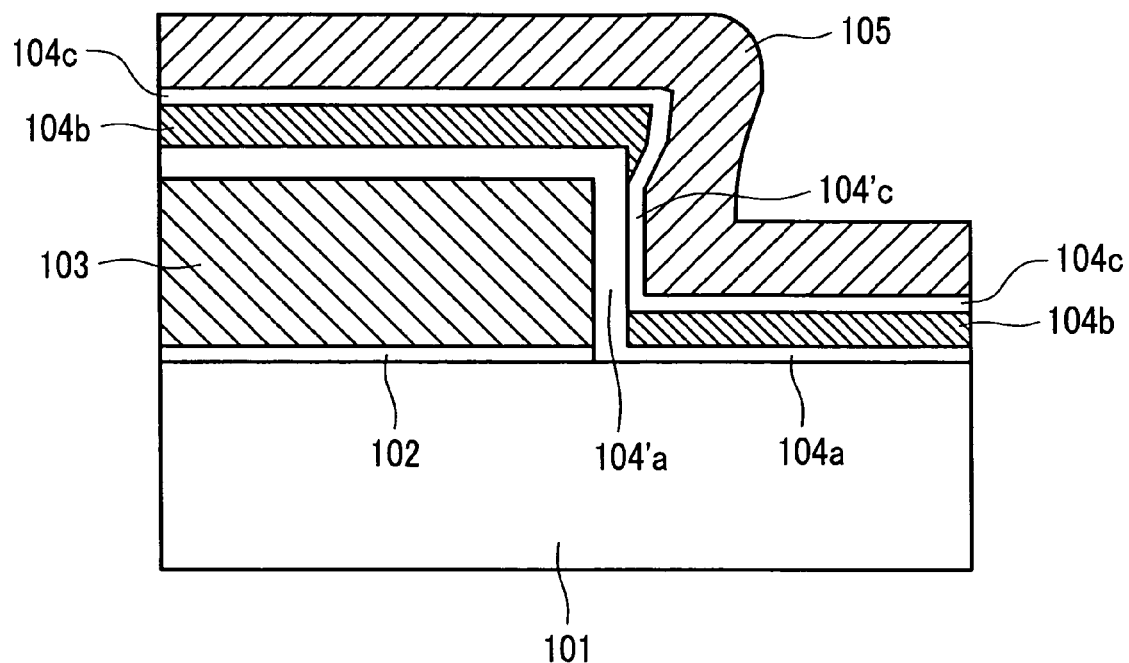
FIG. 4 is a sectional view of a cell showing yet another production process in the first embodiment according to the present invention.

Successively, as shown in FIG. 4, the Si oxide film 104c about 6 nm in thickness acting as an upper layer potential barrier film (hereafter referred to as "top Si oxide film") was formed by oxidizing the Si nitride film 104b by the ISSG (In-Situ Steam Generation) oxidation method at a temperature of 950° C. Thereafter, the phosphor-doped polycrystalline Si film 105 60 nm in thickness containing phosphor by 5e20 atms/cm$^3$ was deposited by the low-pressure CVD method.

When the top Si oxide film about 6 nm in thickness was formed on the Si nitride film 104b by the ISSG oxidation method, the thickness of the Si nitride film 104b reduces by about 3 to 3.5 nm from the deposited film thickness. That is, during the course of forming the top Si oxide film, the Si nitride film 104'b on the thermal oxide film 104'a at the sidewall of the phosphor-doped polycrystalline Si film pattern 103 was completely oxidized and transformed into the Si oxide film 104'c about 4.5 nm in thickness. In other words, by the present invention, a structure wherein an Si nitride film 104b acting as a charge trapping film does not exist on the sidewall of a phosphor-doped polycrystalline Si film pattern 103 is obtained.

In the present embodiment, though the ISSG oxidation method was used for the formation of the top Si oxide film 104c, it is also possible to use the ordinary wet oxidation method. Further, it is of course possible to use the plasma oxidation method or the ozone oxidation method. Furthermore, it is also possible to additionally form a top Si oxide film by the CVD method after the application of the aforementioned oxidation. Here it should be noted that, ISSG oxidation, plasma oxidation and ozone oxidation are mostly dominated by the oxidation by radical components and therefore, even though the oxidation amount is increased, the state where the sidewall of a select gate electrode 103 is extremely oxidized does not appear. However, ordinary wet oxidation is mostly dominated by the oxidation with water, therefore the sidewall of a select gate electrode 103 may considerably be oxidized by the increase of an oxidation amount, and thus it is necessary to pay enough attention at the time of oxidation.

In order to restrain the oxidation of the sidewall of the select gate electrode 103 occurring as a side effect of the aforementioned oxidation of the Si nitride film 104b, it is effective to apply NO oxynitride treatment or $NO_2$ oxynitride treatment after the formation of the bottom Si oxide film 104a of a memory MOS transistor. By applying such a treatment, the reliability of the bottom Si oxide film 104a can be improved and at the same time the oxidation of the sidewall of the select gate electrode 103 can be restrained. It is a matter of course that, regardless of a method for oxidizing the Si nitride film 104b, the reliability of the bottom Si oxide film improves by applying oxynitride treatment beforehand.

Figure 5:
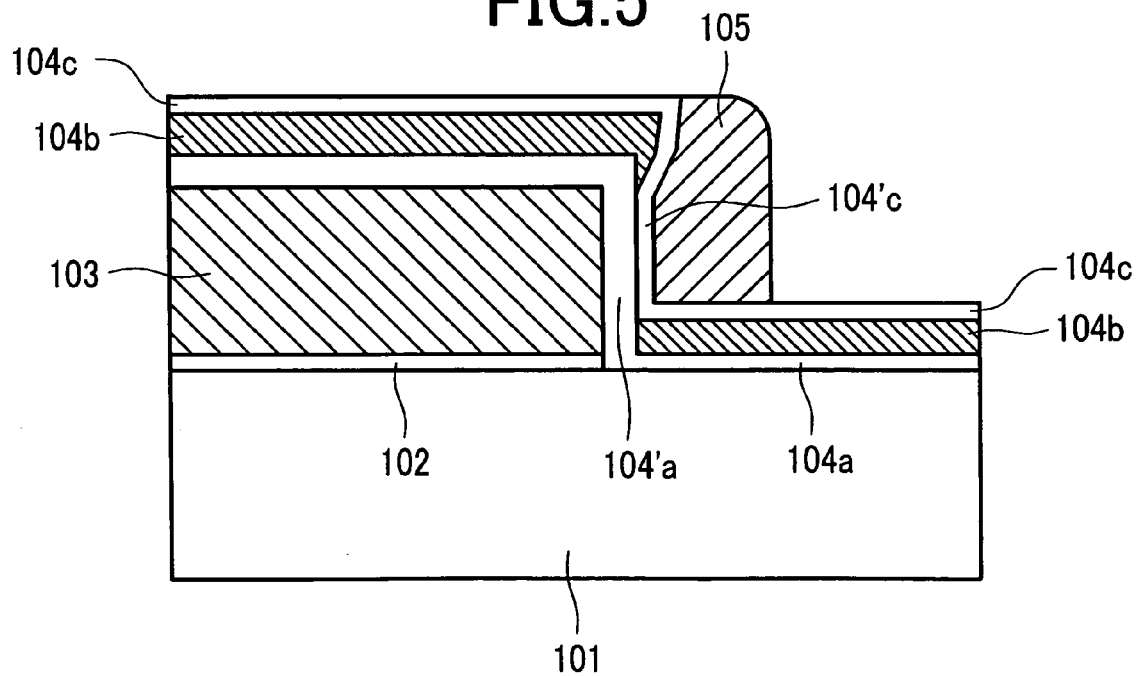
FIG. 5 is a sectional view of a cell showing yet another production process in the first embodiment according to the present invention.

Next, as shown in FIG. 5, by anisotropic dry etching, the phosphor-doped polycrystalline Si film 105 was selectively etched and the side spacer electrode 105 of the polycrystalline Si film 105 was formed on the pattern sidewall. The width of the side spacer electrode 105 on the semiconductor substrate was determined by the deposited film thickness of the polycrystalline Si film 105 formed in FIG. 4 and it served as the gate length of the memory MOS transistor $Q_1$. In the present embodiment, the gate length of the memory MOS transistor was set at 60 nm.

Figure 6:
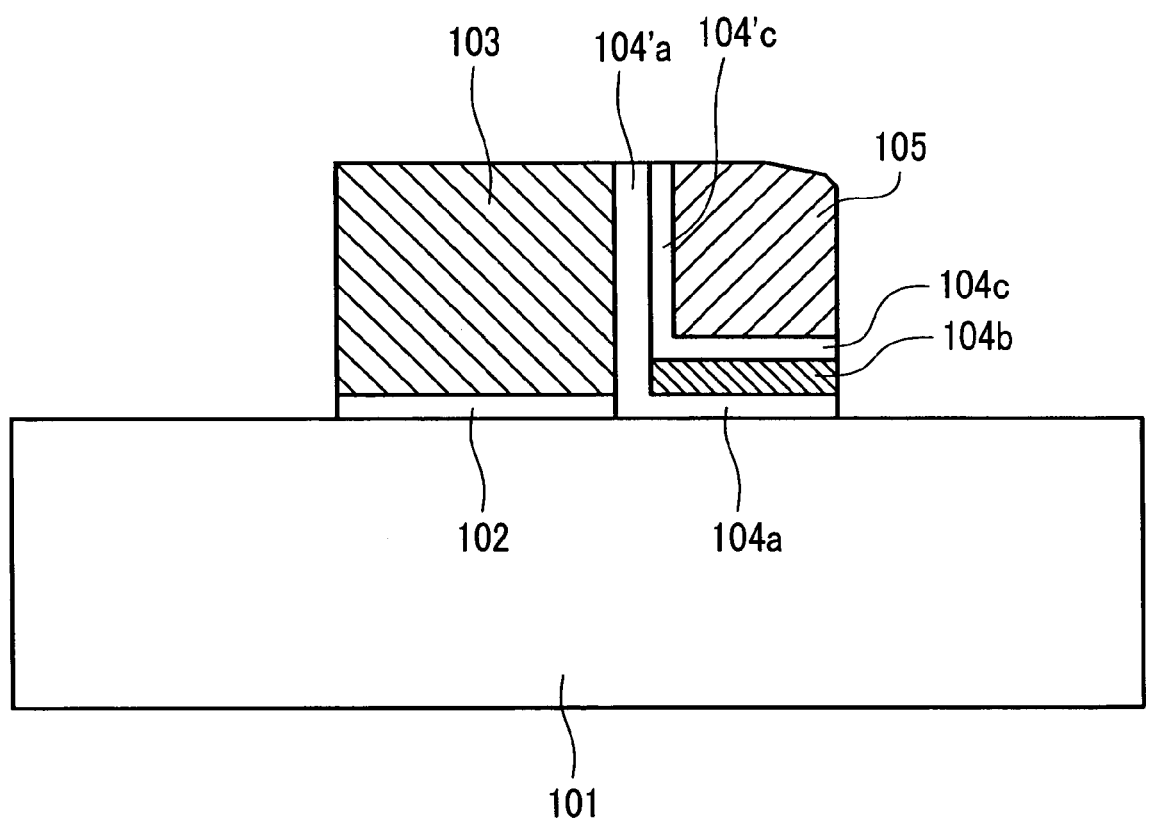
FIG. 6 is a sectional view of a cell showing the production process in the first embodiment according to the present invention.

Next, the top Si oxide film 104c, the Si nitride film 104b and the bottom Si oxide film 104a exposed by the anisotropic dry etching in FIG. 5 were etched sequentially and, as shown in FIG. 6, the surface of the polycrystalline Si film 103 acting as the select gate electrode 103 and th surface of the Si substrate 101 were exposed. Successively, a prescribed resist pattern was formed, the phosphor-doped polycrystalline Si film 103 and the Si oxide film 102 in the other region were subjected to patterning by etching, and the gate length of the select MOS transistor $Q_2$ was determined.

Next, as shown in FIG. 1, after phosphor was injected into the Si substrate at a density of 1e15 atms/cm$^3$ by the ion injection method, heat treatment was applied for 60 sec. at 950° C. and the source 106a and the drain 106b were formed.

Thereafter, the nonvolatile semiconductor memory device having the memory array layout shown in FIG. 7 was produced and thus the present embodiment according to the present invention was completed through a series of the known processes of: forming Si oxide film side spacers on the sidewalls of the gate electrodes 103 and 105 of the select MOS transistor $Q_2$ and the memory MOS transistor $Q_1$; forming Co silicide on the surfaces of both the electrodes 103 and 105, the source region 106a and the drain region 106b; forming the bit line and the leader line; and others.

The electric properties of the MONOS nonvolatile memory of a split gate structure produced in the present embodiment were measured under the voltage conditions shown in FIG. 8 and compared with those of a conventional structure. As the results, whereas the retrieving current and writing time of the former were identical to those of the latter, the erasing time of the former was shortened by about 30%. Resultantly, the hot-hole erasing current could be reduced by about 30%. Further, with regard to endurance characteristics, no unerased electrons were observed and a rewriting durability of 1e5 times or more was secured. Furthermore, as a result of evaluating the status-quo retention property (defined by the variation of threshold voltage) at 150° C. after rewriting and erasing operations of 1e4 times, the property was improved by about two digits in comparison with the conventional structure.

Second Embodiment

Next, the second embodiment according to the present invention is explained on the basis of FIGS. 21 to 26. In the embodiment, in the same way as the first embodiment, three other methods wherein an Si nitride film acting as a charge trapping film was not formed at the sidewall bottom portion of the select gate electrode were investigated. The obtained results are hereunder explained sequentially.

(1) The First Method

Figure 21:
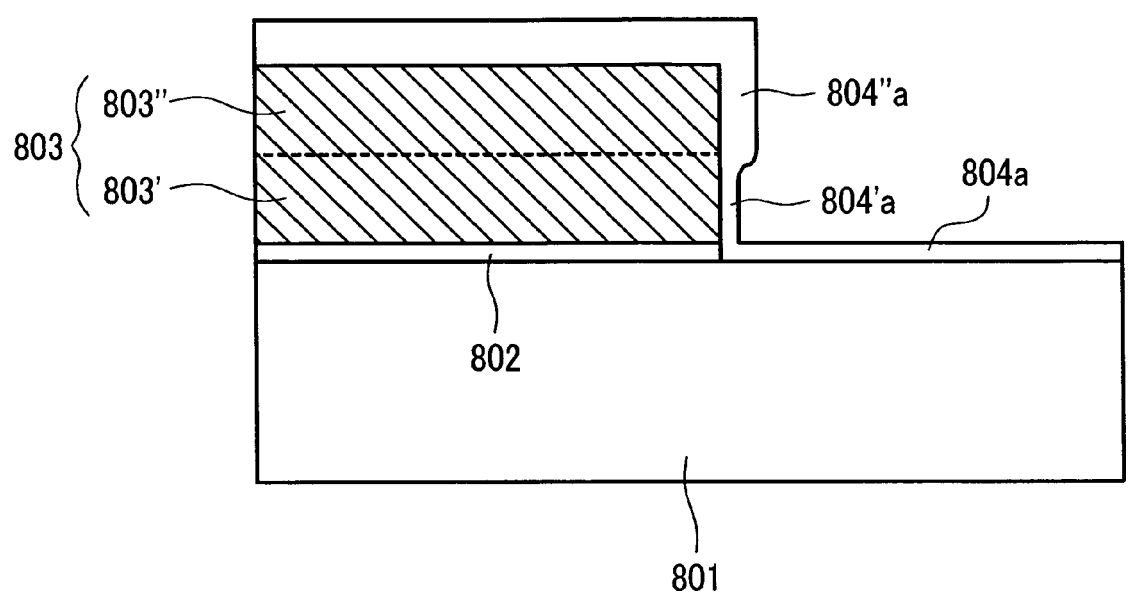
FIG. 21 is a sectional view of a cell showing a first production process representing the second embodiment according to the present invention.
Figure 22:
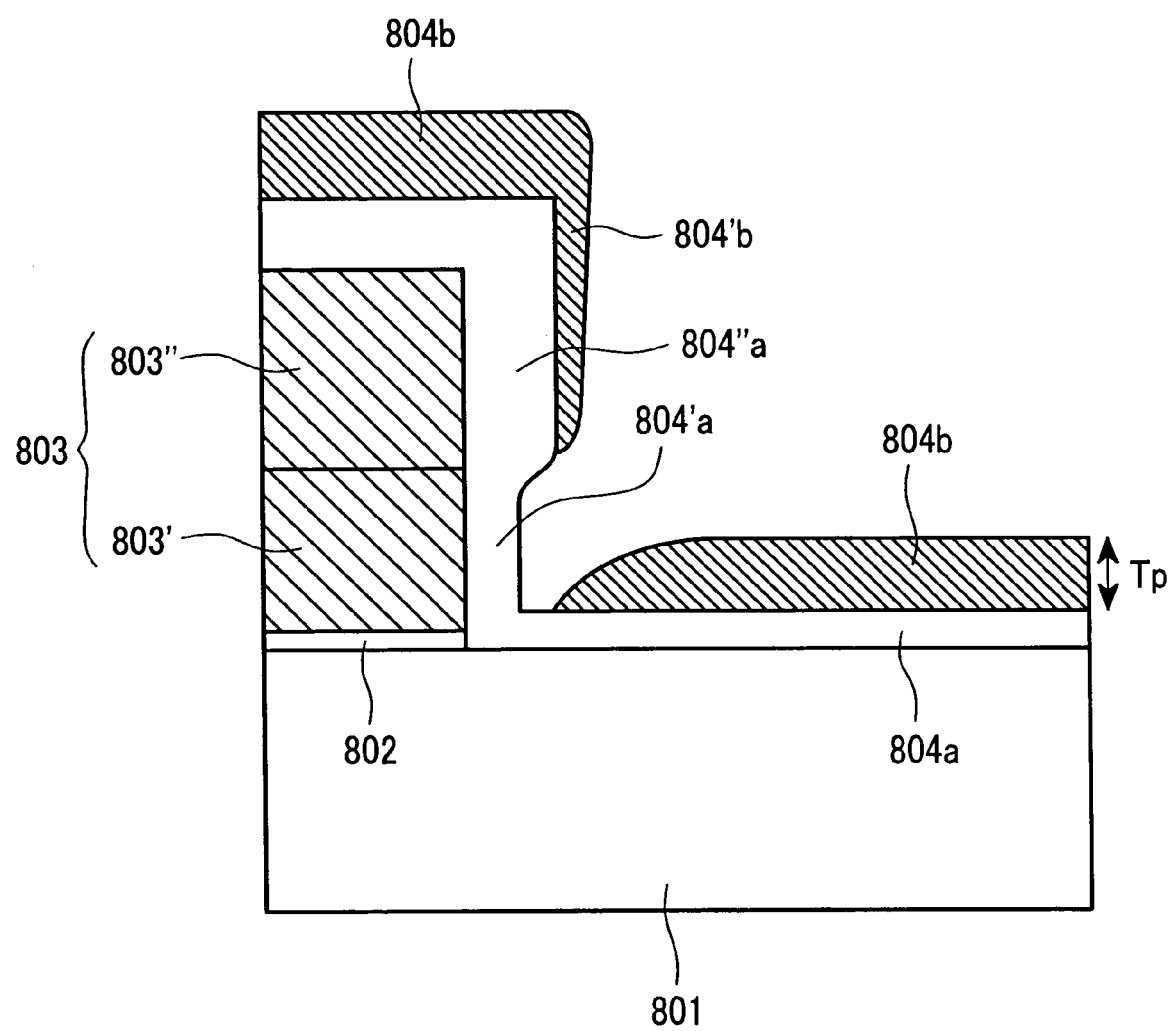
FIG. 22 is a sectional view of a cell showing another first production process representing the second embodiment according to the present invention.

The method is explained on the basis of FIGS. 21 and 22. Firstly, as shown by the sectional view of FIG. 21, the gate insulator film 802 of the select MOS transistor $Q_2$ was formed on the Si substrate 801 in the same way as the first embodiment, and thereafter the non-doped polycrystalline Si film 803 200 nm in thickness was deposited.

Successively, phosphor was injected by 8e15 atms/cm$^2$ into the region 803" about 100 nm distant from the surface of the polycrystalline Si film 803 acting as the select gate electrode 803 by the ion implantation method. Subsequently, the polycrystalline Si film 803 was subjected to an etching process to form the select gate electrode into a prescribed shape and thereafter the Si oxide film 804a 5 nm in thickness was formed on the Si substrate 801 by the wet oxidation method. By the wet oxidation, the Si oxide film 804'a about 6 nm in thickness was also formed on the surface of the non-doped region 803' of the polycrystalline Si film 803. In the meantime, at the region 803" containing phosphor at a high concentration, since impurities are contained therein at a high concentration, the Si oxide film 804"a having a film thickness of about 20 nm that was larger than that of the Si oxide film 804"a was formed. FIG. 21 shows the sectional shape of the product.

Successively, as shown in the sectional view of FIG. 22, the Si nitride film 804b having a thickness Tp of 10 nm at the flat portion was deposited by the dual-frequency reactive sputter deposition method. Here, the frequencies applied to the electrode side and the substrate side in the sputtering were set at 13.56 MHz and 400 KHz respectively and the temperature of the substrate was set at 200° C. FIG. 22 shows the pattern shape immediately after the deposition. In the present embodiment, the sidewall of the polycrystalline Si film pattern 803 was configured so that the thickness of the Si oxide film 804"a at the upper part of the pattern sidewall was larger than that at the lower part thereof and therefore the sectional shape before the deposition of the Si nitride film 804b was an overhang shape.

In the case of the dual-frequency sputter deposition method employed in the present embodiment, the step coverage improved to some extent in-comparison with the collimated sputter deposition method shown in the first embodiment and for that reason the Si nitride film 804'b about 3 nm in thickness was formed at the upper portion of the sidewall of the polycrystalline Si film pattern 803. However, in the present embodiment, the sidewall portion of the polycrystalline Si film pattern 803 had an overhang shape and therefore an Si nitride film 804b was not formed at the bottom portion of the sidewall (FIG. 22).

Figure 23:
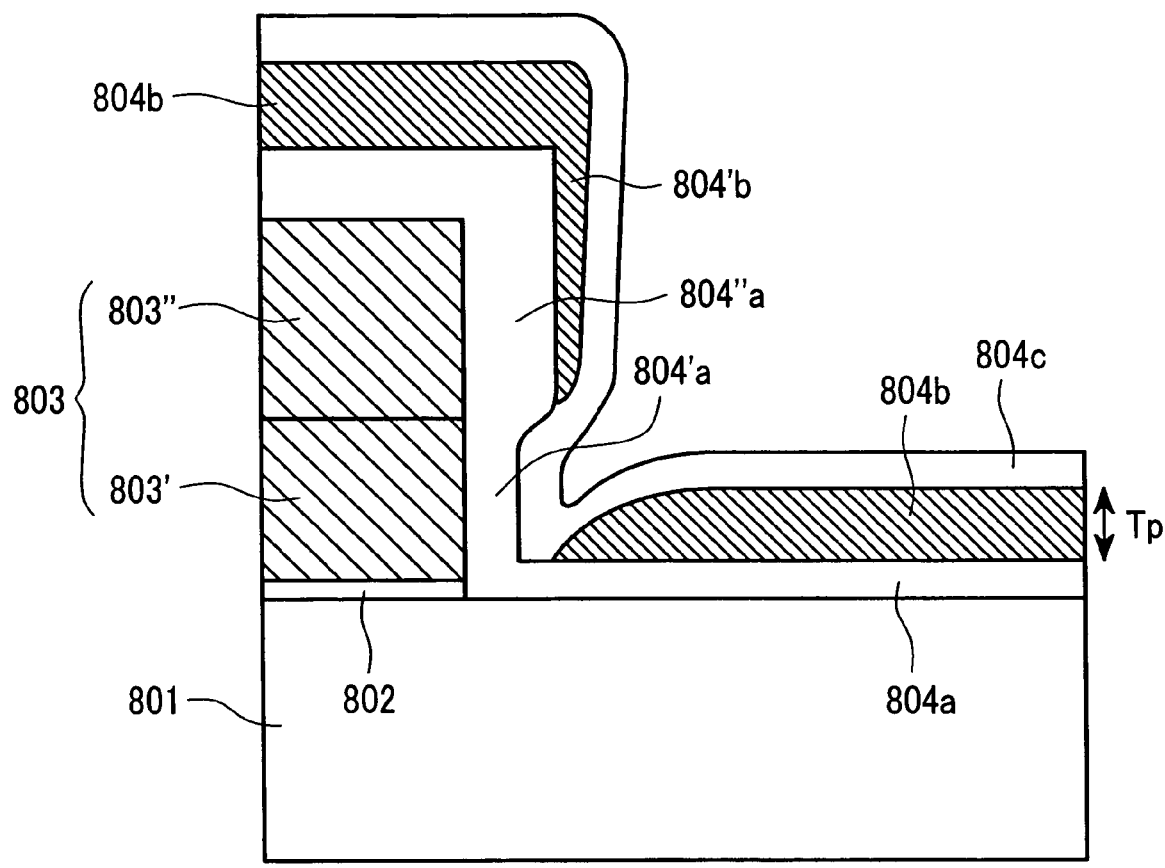
FIG. 23 is a sectional view of a cell showing yet another first production process representing the second embodiment according to the present invention.
Figure 24:
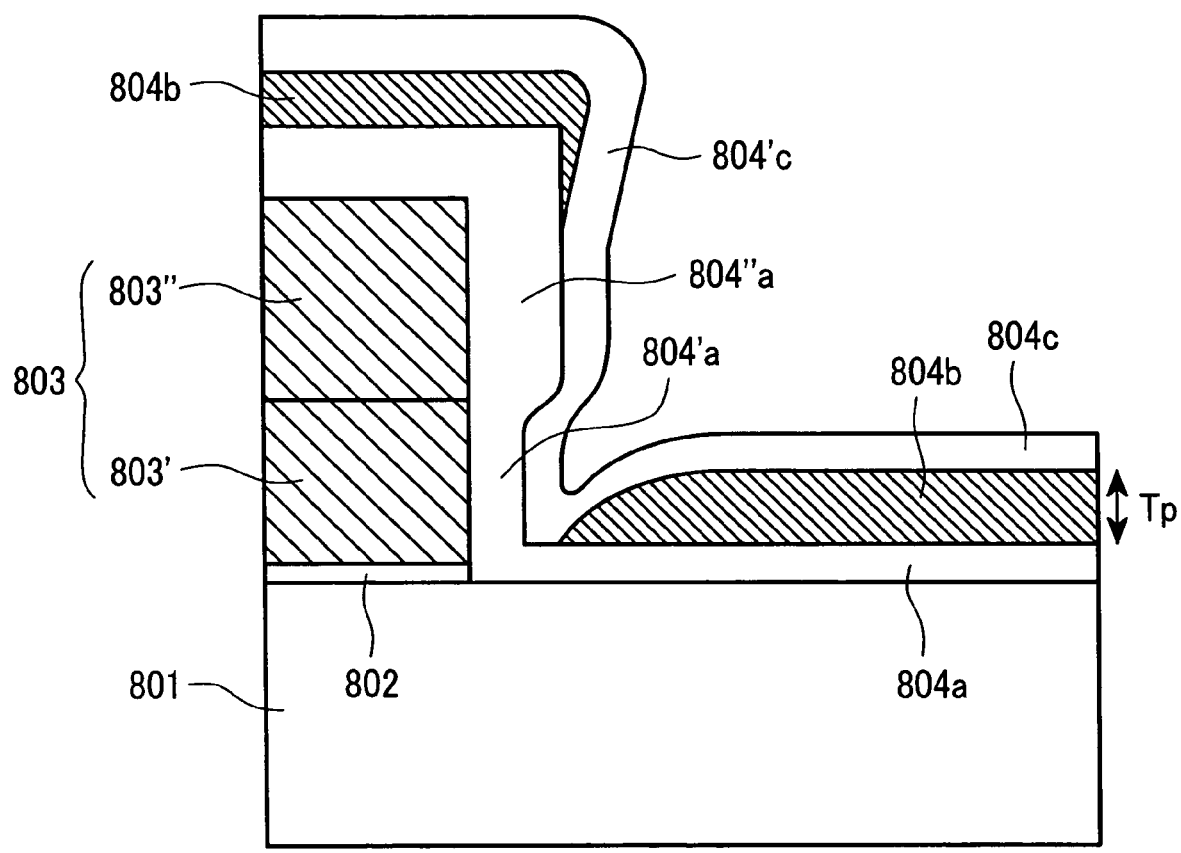
FIG. 24 is a sectional view of a cell showing yet another first production process representing the second embodiment according to the present invention.

Subsequently, the top Si oxide film 804c was formed. Here, two kinds of specimens were produced; one produced by forming the top Si oxide film 804c by the low-pressure CVD method as shown in FIG. 23 and the other produced by applying ISSG oxidation and thereafter depositing the Si oxide film by the low-pressure CVD method as shown in FIG. 24. After that, the MONOS memories (refer to FIG. 1) of a split gate structure were produced by the same method as employed in the first embodiment.

(2) The Second Method

Figure 25:
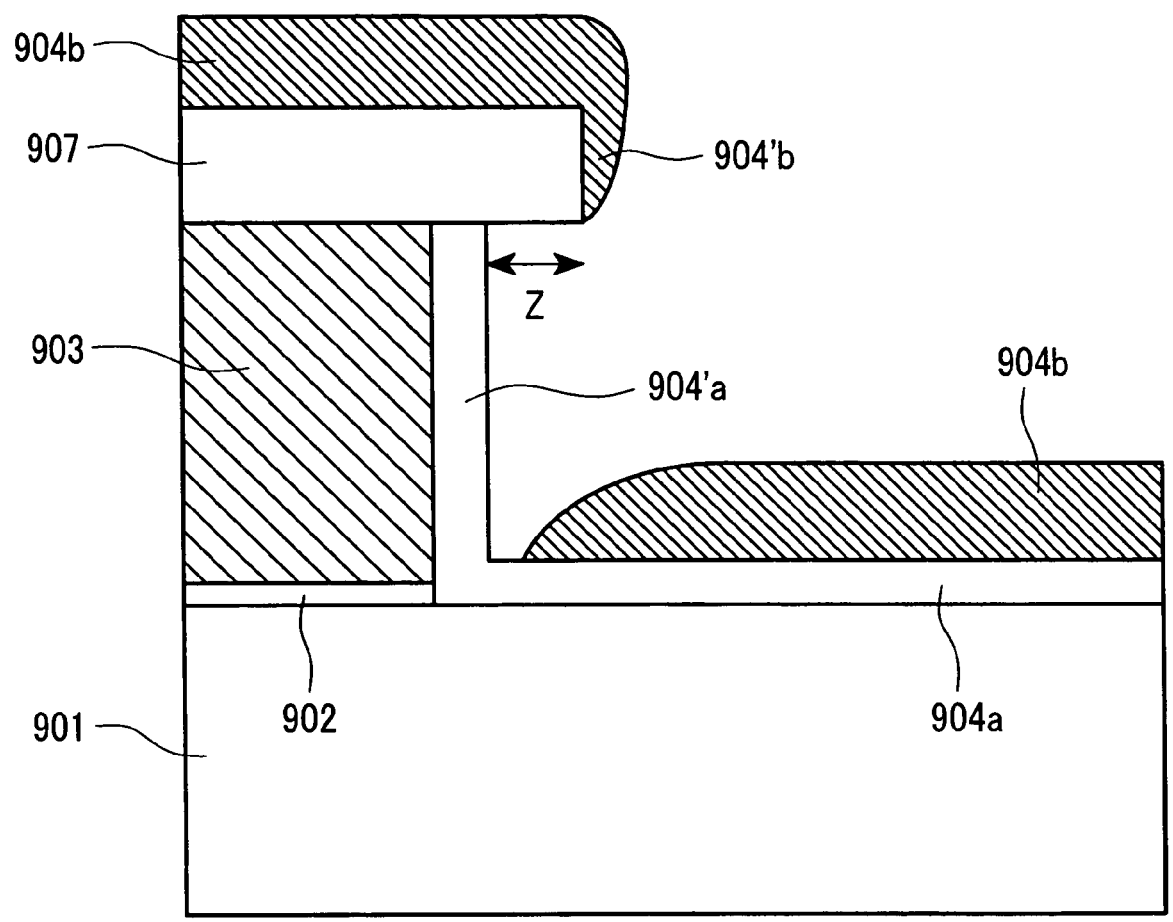
FIG. 25 is a sectional view of a cell showing the second production process representing the second embodiment according to the present invention.

Next, the second method is explained on the basis of FIG. 25. In the same way as the first method, the gate oxide film 902 of the select MOS transistor $Q_2$ was formed on the Si substrate 901 and thereafter the polycrystalline Si film 903 150 nm in thickness containing phosphor by 5e20 atms/cm$^3$ was deposited.

Successively, after the Si oxide film 907 50 nm in thickness was deposited by the low-pressure CVD method, the Si oxide film 907 and the polycrystalline Si film 903 were formed into the select gate electrode of the prescribed shape by using a known technique. After the polycrystalline Si film 903 was subjected to patterning, the polycrystalline Si film 903 was retreated from the pattern edge of the Si oxide film 907 by the isotropic dry etching method. The retrieval amount Z of the polycrystalline Si film 903 can be set at an arbitrary value by changing a dry etching time. The retrieval amount Z was set at 30 nm in the present embodiment. If the value of Z is too large, electrons cannot be injected into the Si nitride film 904b acting as a charge trapping film and therefore a preferable retrieval amount Z is 40 nm or less.

Successively, the bottom Si oxide film 904a and the Si nitride film 904b were formed by the same method as the first method described earlier. By the method, since the Si oxide film pattern 907 formed on the select gate electrode 903 was formed into an overhang shape, the structure wherein an Si oxide film was not formed on the sidewall of the select gate electrode 903 was obtained as shown in FIG. 25.

Though the retrieval amount Z of the polycrystalline Si film 903 was set at 30 nm in the present embodiment, the value is only an example and the present invention is not limited to the value. Thereafter, the MONOS memory of a split gate structure (refer to FIG. 1) was produced by the same method as the first embodiment.

(3) The Third Method

Figure 26:
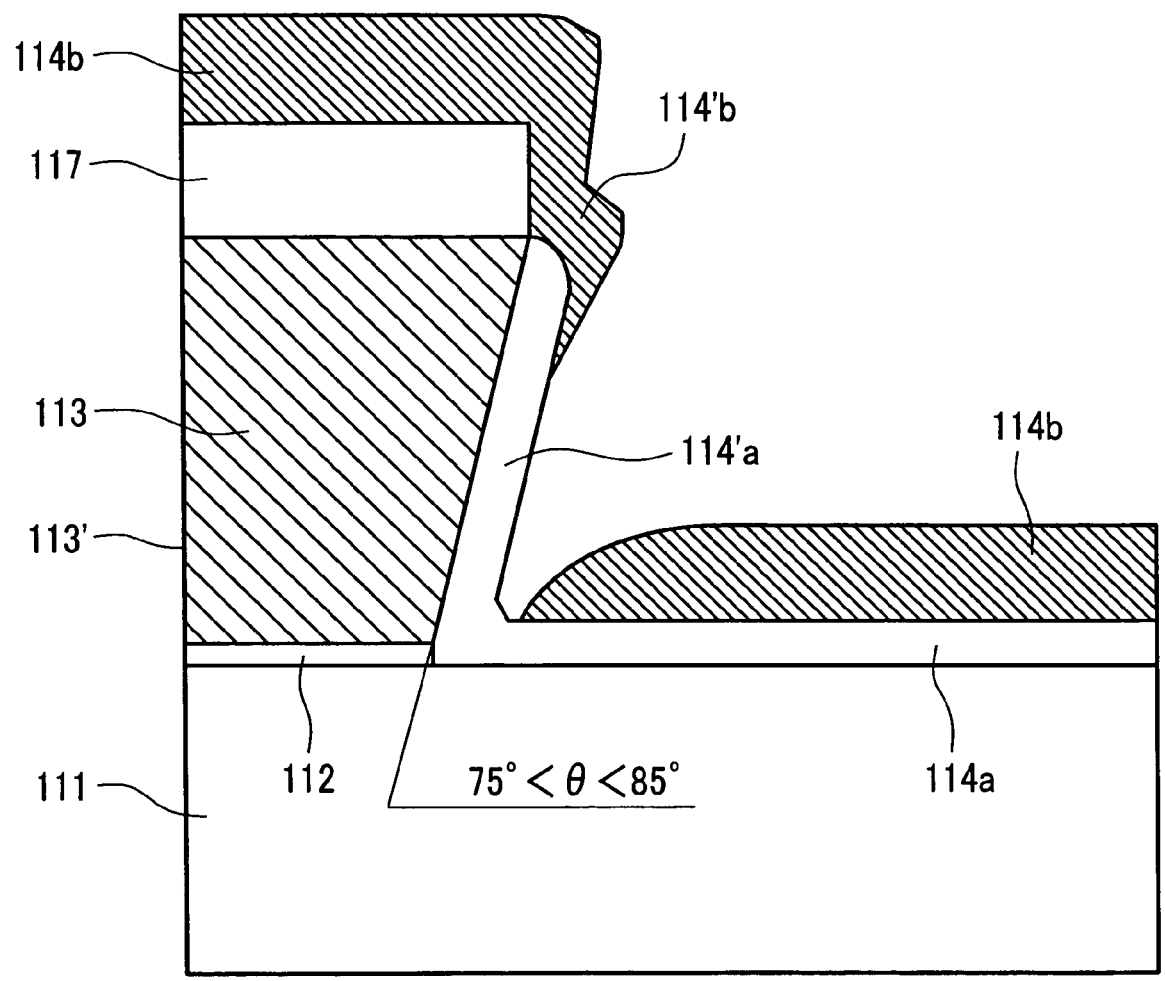
FIG. 26 is a sectional view of a cell showing the third production process representing the second embodiment according to the present invention.

Next, the third method is explained on the basis of FIG. 26. In the same way as the above first method, the gate oxide film 112 of the select MOS transistor $Q_2$ was formed on the Si substrate 111 and thereafter the polycrystalline Si film 113 150 nm in thickness containing phosphor by 5e20 atms/cm$^3$ was deposited. Successively, after the Si oxide film 117 50 nm in thickness was deposited by the low-pressure CVD method, the Si oxide film 117 was formed into a prescribed shape by using a known technique and the underlying polycrystalline Si film 113 was exposed.

Successively, the polycrystalline Si film 113 was formed into an inversely tapered shape by optimizing the dry etching conditions. The inverse taper angle θ of the polycrystalline Si film 113 can be set at an arbitrary value in accordance with the dry etching conditions. The inverse taper angle θ was set at 80° in the present embodiment. If the inverse taper angle decreases, the processing variability increases. Therefore, a preferable inverse taper angle is in the range from 75° to 90°.

Successively, the bottom oxide film 114a and the Si nitride film 114b were formed by the same method as the first method. By the method, since the select gate electrode 113 was formed into an overhang shape, the structure wherein an Si nitride film was not formed on the sidewall of the select gate electrode 113 was obtained as shown in FIG. 26. Thereafter, the MONOS memory of a split gate structure (refer to FIG. 1) was produced by the same method as the first embodiment.

The electric properties of the MONOS nonvolatile memories of a split gate structure produced by the three methods shown in the present embodiment were measured under the voltage conditions shown in FIG. 8 and compared with those of a conventional structure. As the results, whereas the retrieving current and the writing time of the former were identical to those of the conventional memory, the erasing time was shortened by about 30%. Resultantly, the hot-hole erasing current could be reduced by about 30%.

Further, with regard to endurance characteristics, no unerased electrons were observed and a rewriting durability of 1e6 times or more was secured like the first embodiment. Furthermore, as a result of evaluating the status-quo retention property (defined by the variation of threshold voltage) at 150° C. after rewriting and erasing operations of 1e4 times, the property was improved by about two digits in comparison with the conventional structure.

Third Embodiment

Next, the third embodiment according to the present invention is explained. The present embodiment corresponds to the example of the second configuration outlined earlier on the basis of FIG. 19 and is explained on the basis of the sectional views shown in FIGS. 9 to 13. The structure of memory array (refer to FIG. 7) and the setting of each voltage (refer to FIG. 8) in the present embodiment were identical to those of the first embodiment.

Figure 9:
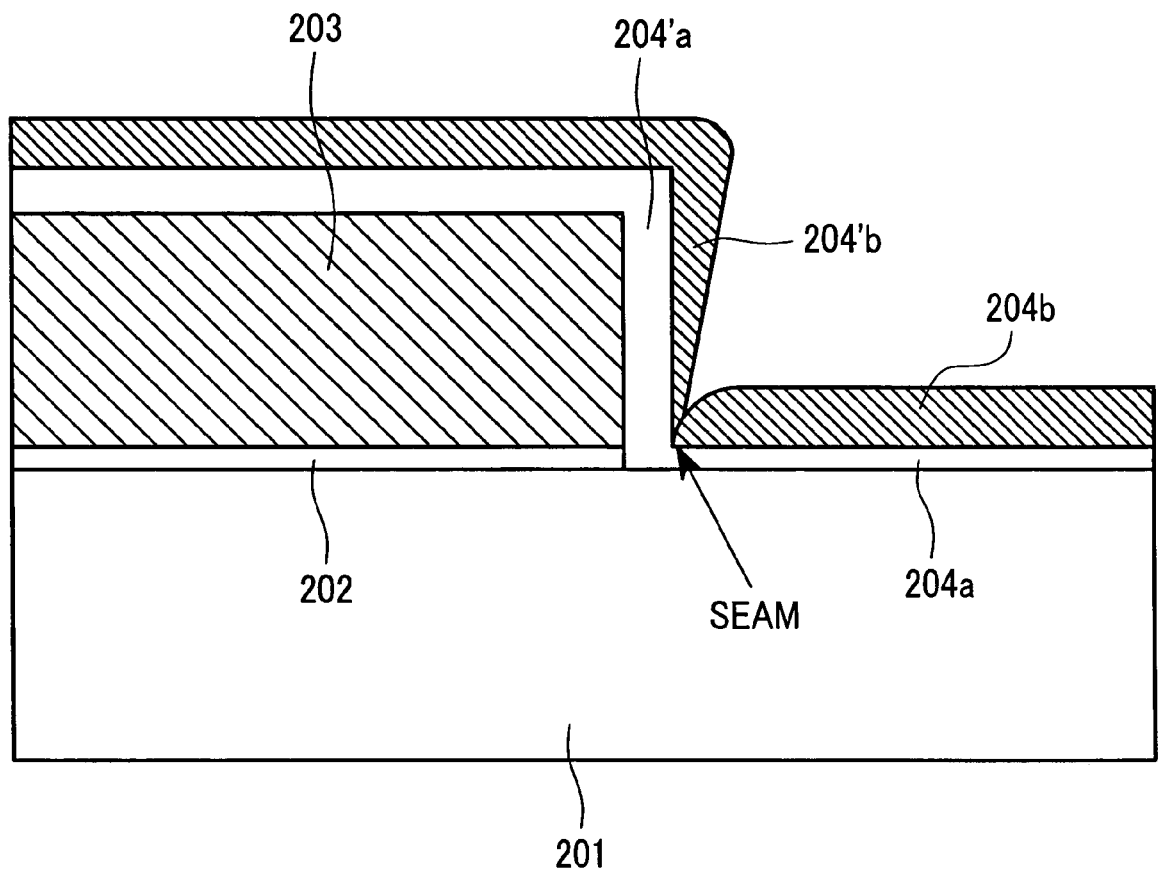
FIG. 9 is a sectional view of a cell showing a production process in the third embodiment according to the present invention.

As shown in FIG. 9, firstly, by the same method as the first embodiment, the gate insulator film 202 of the select MOS transistor $Q_2$ was formed on the p-type well region (Si substrate), the phosphor-doped polycrystalline Si film 203 acting as the select gate electrode 203 was patterned, and the bottom Si oxide film 204a of the memory MOS transistor $Q_1$ was formed. Successively, the Si nitride film 204b acting as the charge trapping film was formed by the Plasma enhanced CVD method.

As widely known, an Si nitride film formed by the thermal CVD method that uses $SiH_2Cl_2$ and $NH_3$ as the material gas shows the step coverage of almost 100%. In contrast, in the case of the plasma enhanced CVD method, the step coverage thereof is far inferior to that of the thermal CVD method. For example, an Si nitride film formed by the plasma enhanced CVD method that uses $SiH_4$ (monosilane), $NH_3$ and $N_2$ as the material gas forms an overhang shape at the upper step portion of the pattern as shown in FIG. 9 and the thickness of the step sidewall 204'b decreases gradually from the upper part of the step to the bottom.

In particular, the thickness of the pattern sidewall bottom portion (edge region of the pattern lower portion, shown as "seam" by the arrow) decreases up to about 40% of the thickness of the flat portion. The deposition shape of the Si nitride film formed by the plasma enhanced CVD method shown in the present embodiment was quite similar to that of an Si nitride film formed by the reactive plasma sputter deposition method shown in the first embodiment. In contrast, as a result of comparing the step coverage, whereas the step coverage was 20 to 30% in the case of the reactive plasma sputter deposition method, it was 40 to 60% in the case of the plasma enhanced CVD method and therefore the plasma enhanced CVD method was superior.

In the case of the plasma enhanced CVD method, the plasma ion irradiation hardly occurs at the Si nitride film 204'b at the step sidewall, thus sufficient energy cannot be supplied to the Si nitride film 204'b, and the density and Si—N bond energy of the Si nitride film 204'b are lower than those of the Si nitride film at the flat portion. It has commonly been known that, for that reason, the Si nitride film 204'b is inferior to the Si nitride film 204b at the flat portion in chemical resistance and oxidation resistance.

Further, as shown in FIG. 9, the pattern sidewall bottom portion (expressed as "seam") becomes the boundary between the Si nitride film 204'b having grown from the sidewall and the Si nitride film 204b having grown from the flat portion and therefore a seam is caused. The seam is the region that has the least degree of the aforementioned chemical resistance and oxidation resistance and therefore it is quite easy to separate the Si nitride film 204'b on the step sidewall from the Si nitride film 204b at the bottom portion by means of, for example, etching and oxidation with dilute hydrofluoric acid aqueous solution.

In the present embodiment, a plasma enhanced CVD device of the dual-frequency excitation type that uses $SiH_4$, $NH_3$ and $N_2$ as the material gas was used for the formation of the Si nitride films 204b and 204'b. A high frequency voltage of 13.56 MHz was applied to the electrode side and a low frequency voltage of 380 KHz was applied to the Si substrate side, and further the temperature of the substrate was set at 430° C.

In the present embodiment, the thickness of the Si nitride film 204b at the flat portion was 12 nm, the average thickness of the pattern sidewall of the select gate electrode 203 was 6 nm, and the thickness of the Si nitride film 204'b at the pattern sidewall bottom portion being located closer to the seam and having the thinnest thickness was 4.8 nm (FIG. 9).

Figure 10:
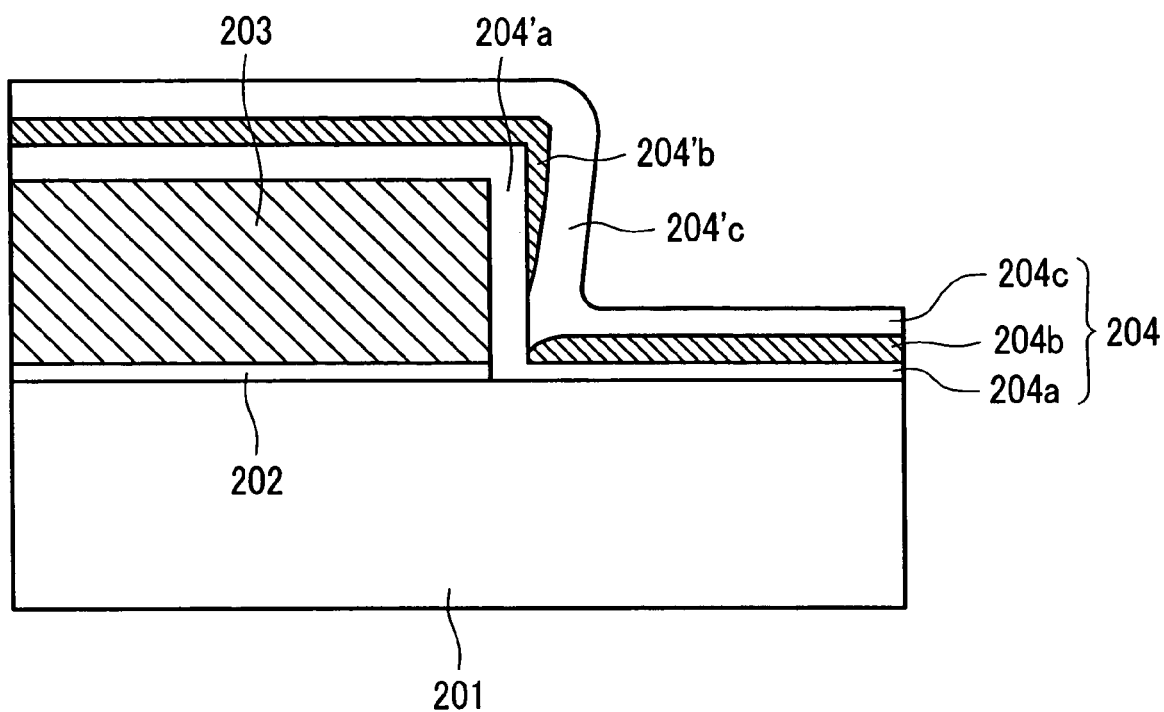
FIG. 10 is a sectional view of a cell showing another production process in the third embodiment according to the present invention.

Next, as shown in FIG. 10, the top Si oxide film 204c of the memory MOS transistor $Q_1$ was formed by applying ISSG oxidizing to the Si nitride film 204b by the same method as the first embodiment. The thickness of the top Si oxide film 204c was changed in the range from 3 to 7 nm with the aim of the oxidation separation of the Si nitride film seam portion of the pattern sidewall bottom portion. Here, the thickness of the top Si oxide film 204c meant the one measured at the flat portion sufficiently apart from the pattern edge.

As a result of evaluating the thickness of the top Si oxide film after subjected to ISSG oxidation, the thickness of the top Si oxide film 204'c on the Si nitride film 204'b on the pattern sidewall of the select gate electrode 203 was about 1.3 to 1.6 times the thickness of the top Si oxide film 204c on the Si nitride film 204b at the flat portion. This is because the quality of the Si nitride film varies in accordance with the irradiation amount of plasma ions as shown earlier.

Figure 11:
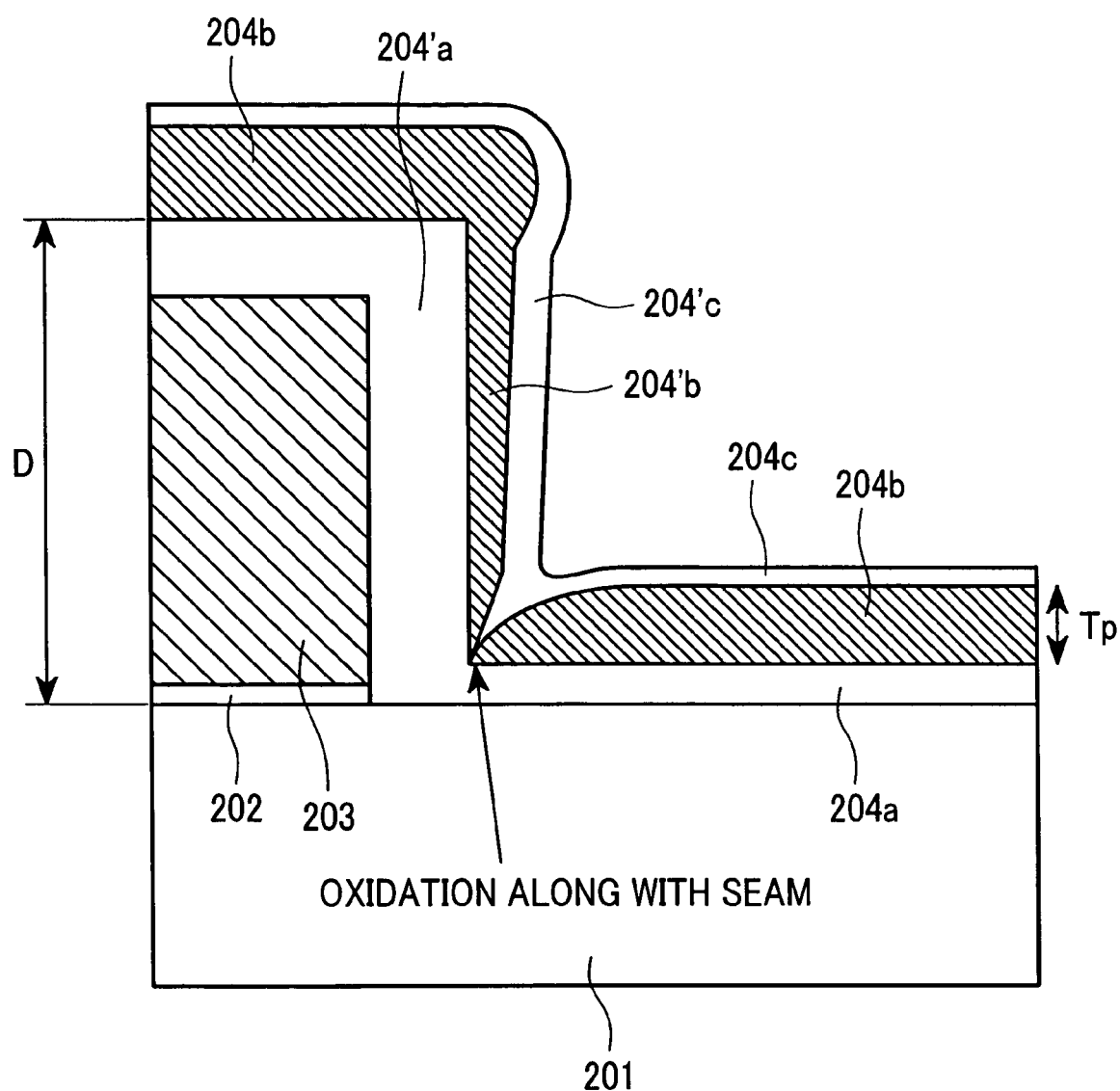
FIG. 11 is a sectional view of a cell showing yet another production process in the third embodiment according to the present invention.

Further, as a result of investigating the development of the shape in ISSG oxidation precisely, it was found that the oxidation of an Si nitride film proceeded along the seam at the pattern sidewall bottom portion and separated the Si nitride film 204'b on the pattern sidewall from the Si nitride film 204b at the bottom portion, as shown in FIG. 11.

That is, according to the present embodiment, by controlling the deposition conditions, the deposit thickness and the oxidation amount of an Si nitride film 204b formed by the plasma enhanced CVD method, it is possible to completely oxidize the seam of the Si nitride film existing at the pattern sidewall bottom-portion and to separate the Si nitride film 204'b on the pattern sidewall from the Si nitride film 204b at the bottom portion at an arbitrary width. In the present embodiment, the samples were produced by controlling the deposition conditions and the oxidation amount of the Si nitride film 204b and setting the separation width at about 2 to 6 nm.

Figure 12:
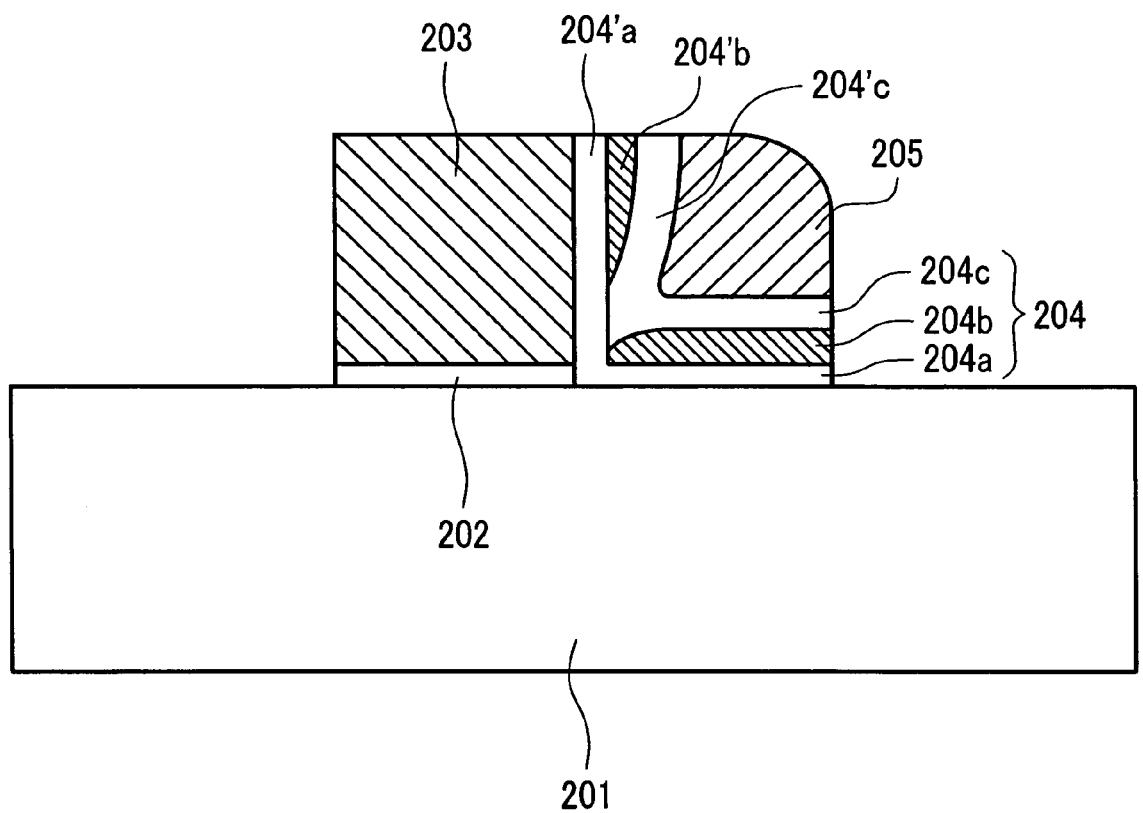
FIG. 12 is a sectional view of a cell showing yet another production process in the third embodiment according to the present invention.
Figure 13:
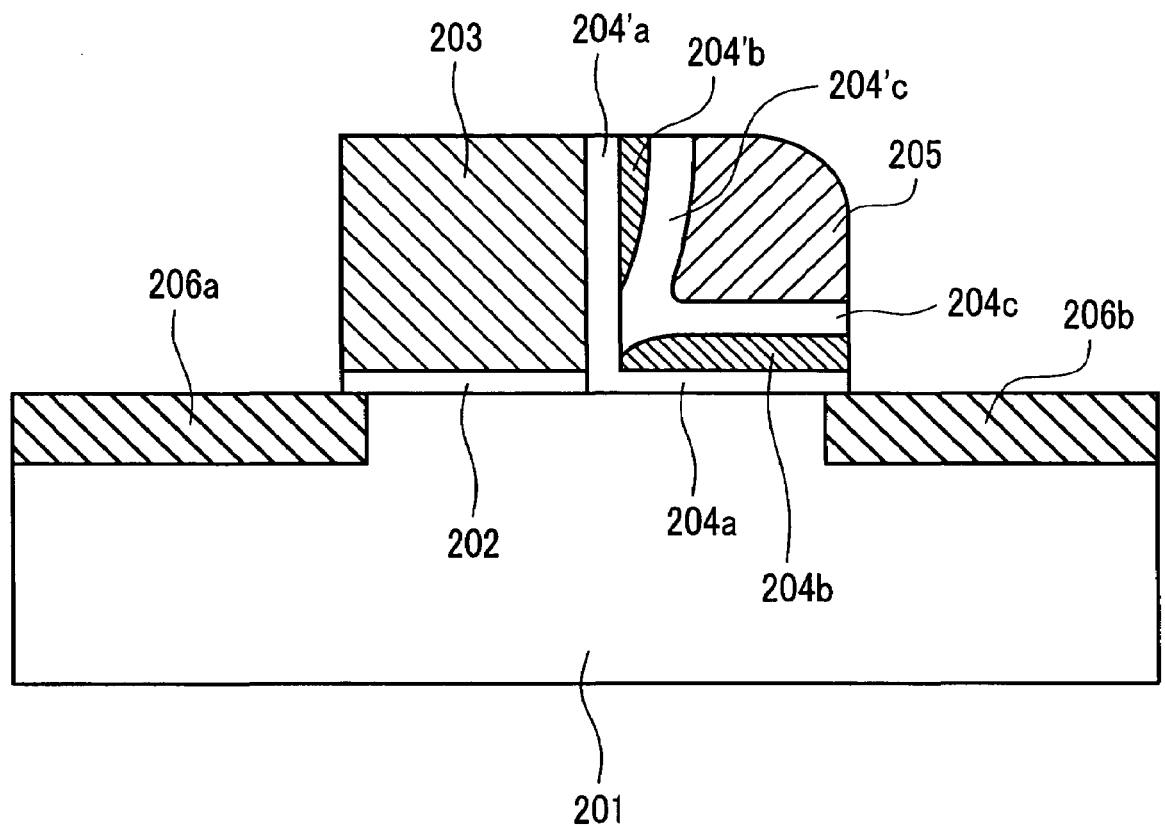
FIG. 13 is a sectional view of a cell showing yet another production process in the third embodiment according to the present invention.

Next, as shown in FIG. 12, after the phosphor-doped polycrystalline Si film acting as the memory gate electrode 205 was deposited to the thickness of 60 nm, the memory gate electrode 205 and the select gate electrode 203 were formed by the same method as the first embodiment.

Figure 19:
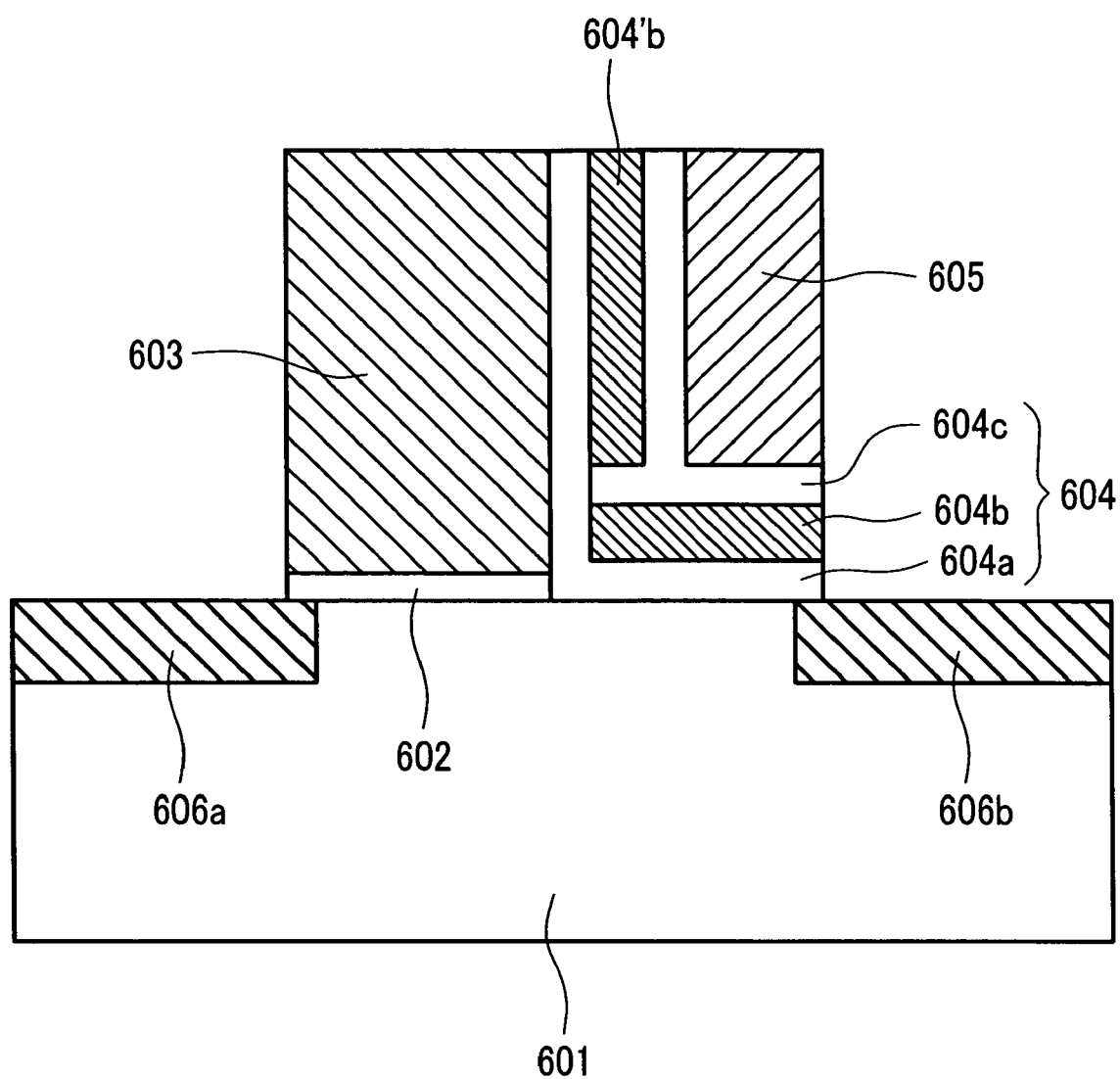
FIG. 19 is a sectional view of a cell explaining an example of the second split gate structure according to the present invention.
Figure 20:
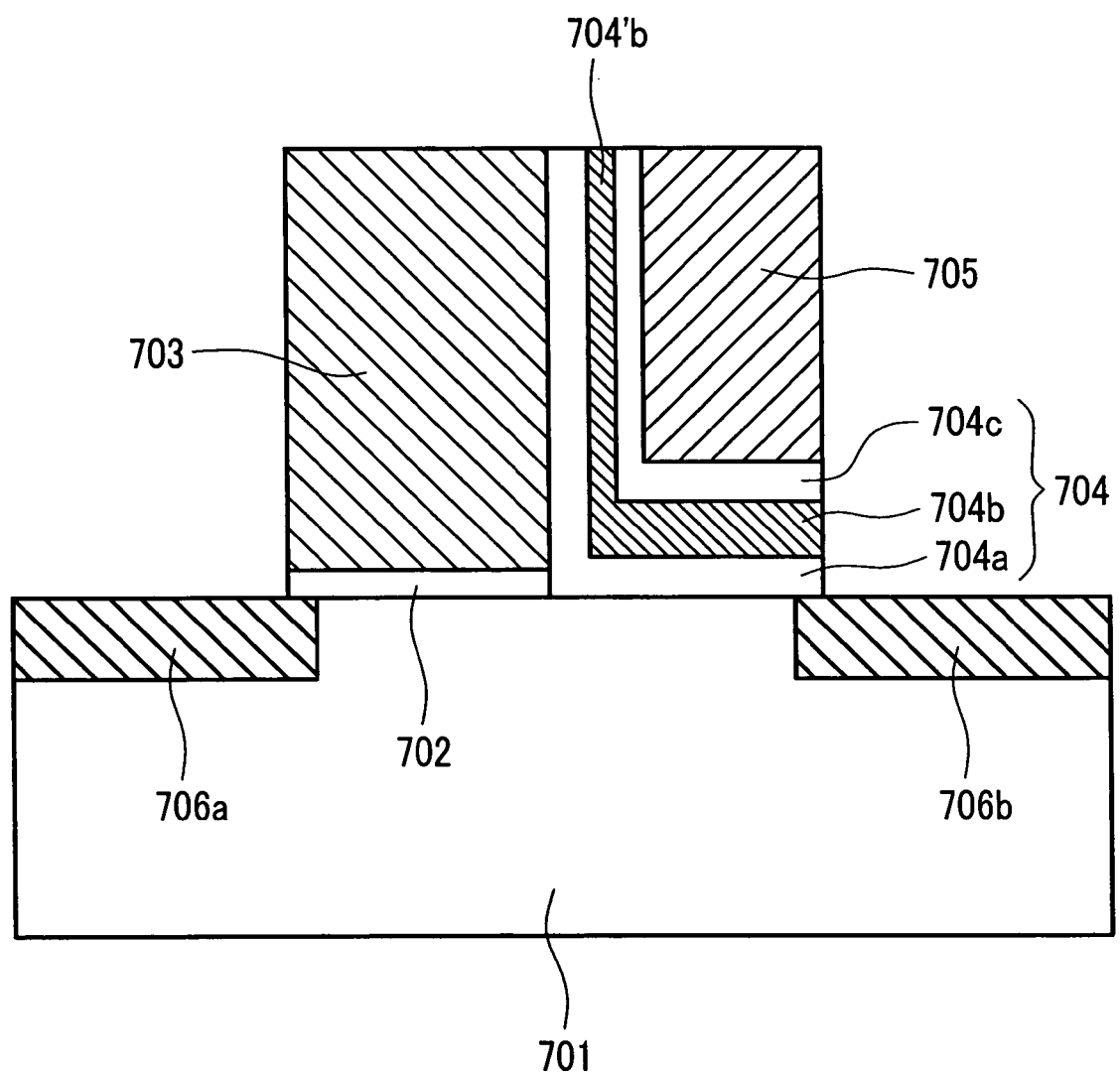
FIG. 20 is a sectional view of a cell explaining an example of the third split gate structure according to the present invention.

After that, the source and drain were formed on the semiconductor substrate 201 and the MONOS memory of a split gate structure, which represents the example of the second configuration shown in FIG. 19, was produced by using the same production method as the first embodiment.

The electric properties of the MONOS nonvolatile memory of a split gate structure produced in the present embodiment were compared with those of a conventional structure under the voltage conditions shown in FIG. 8.

In the present embodiment, as shown in FIG. 12, the structure was configured so that the thickness of the Si nitride film 204'b located between the select gate electrode 203 and the memory gate electrode 205 was thinner than that of the Si nitride film 204b located between the Si substrate 201 and the memory gate electrode 205. As a result, the amount of hot electrons injected into the Si nitride film 204'b on the pattern sidewall of the select gate electrode 203 decreased significantly.

In addition, since the Si nitride film 204'b on the pattern sidewall of the select gate electrode 203 and the Si nitride film 204b at the flat portion were separated from each other by the top Si oxide film 204c during the course of the formation of the top Si oxide film 204c, the diffusion of electrons into the Si nitride film 204'b at the pattern sidewall bottom portion (the diffusion of electrons caused by self electric field and thermal diffusion caused by high temperature (150° C.) retention) was suppressed.

As a result, in the present embodiment, similarly to the study results of the first embodiment, whereas the retrieving current and the writing time were identical to those of the conventional memory, the amount of electrons trapped in the Si nitride film 204'*b* on the pattern sidewall was small and resultantly the erasing time was shortened by about 20%. Resultantly, in the present embodiment too, the erasing current for generating hot holes could be reduced by about 20%. Further, with regard to endurance characteristics, no unerased electrons were observed up to 5e5 times. Furthermore, as a result of evaluating the status-quo retention property (defined by the variation of threshold voltage) at 150° C. after rewriting and erasing operations of 1e4 times, the property was improved by about 1.5 digits in comparison with the conventional structure.

Note that, though the sidewall of the select gate electrode before the formation of the Si nitride film was vertically formed in the present embodiment, it is also possible to form it into an overhang shape or an inversely tapered shape as shown in the second embodiment.

Fourth Embodiment

Figure 14:
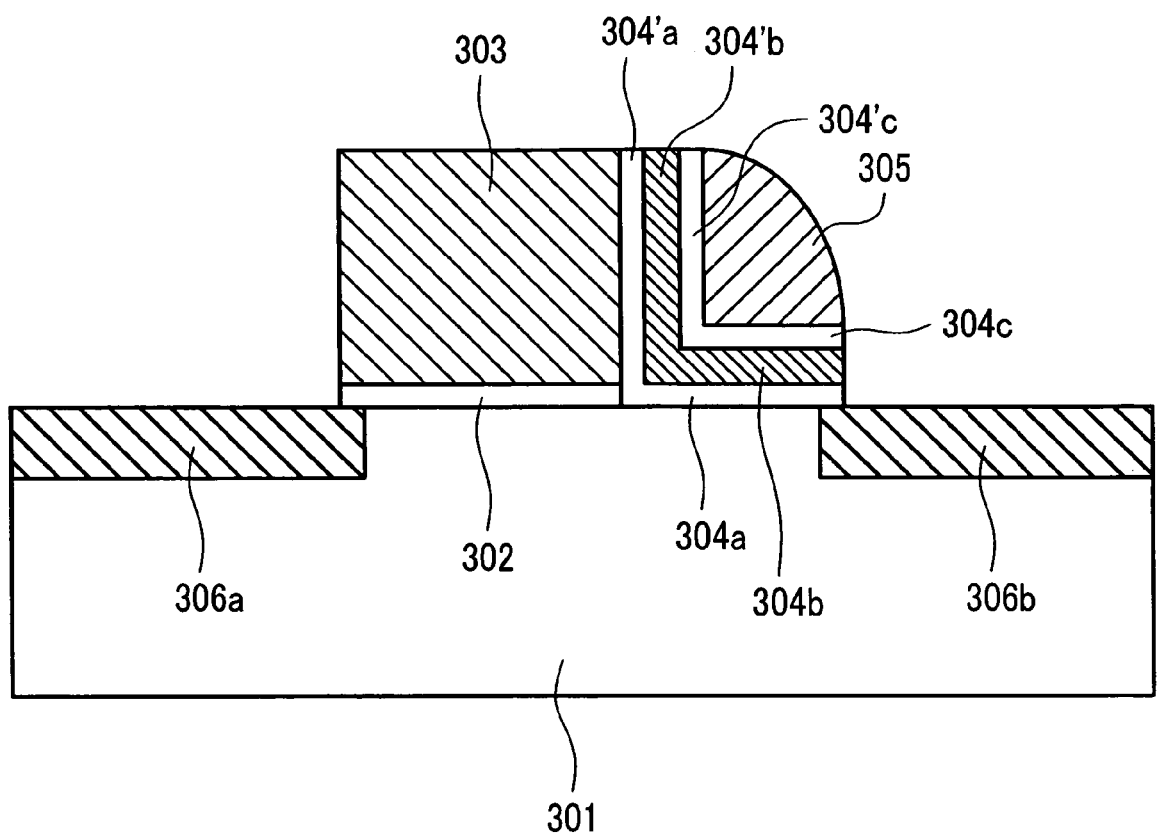
FIG. 14 is a sectional view of a cell showing the production process in the fourth embodiment according to the present invention.
Figure 15:
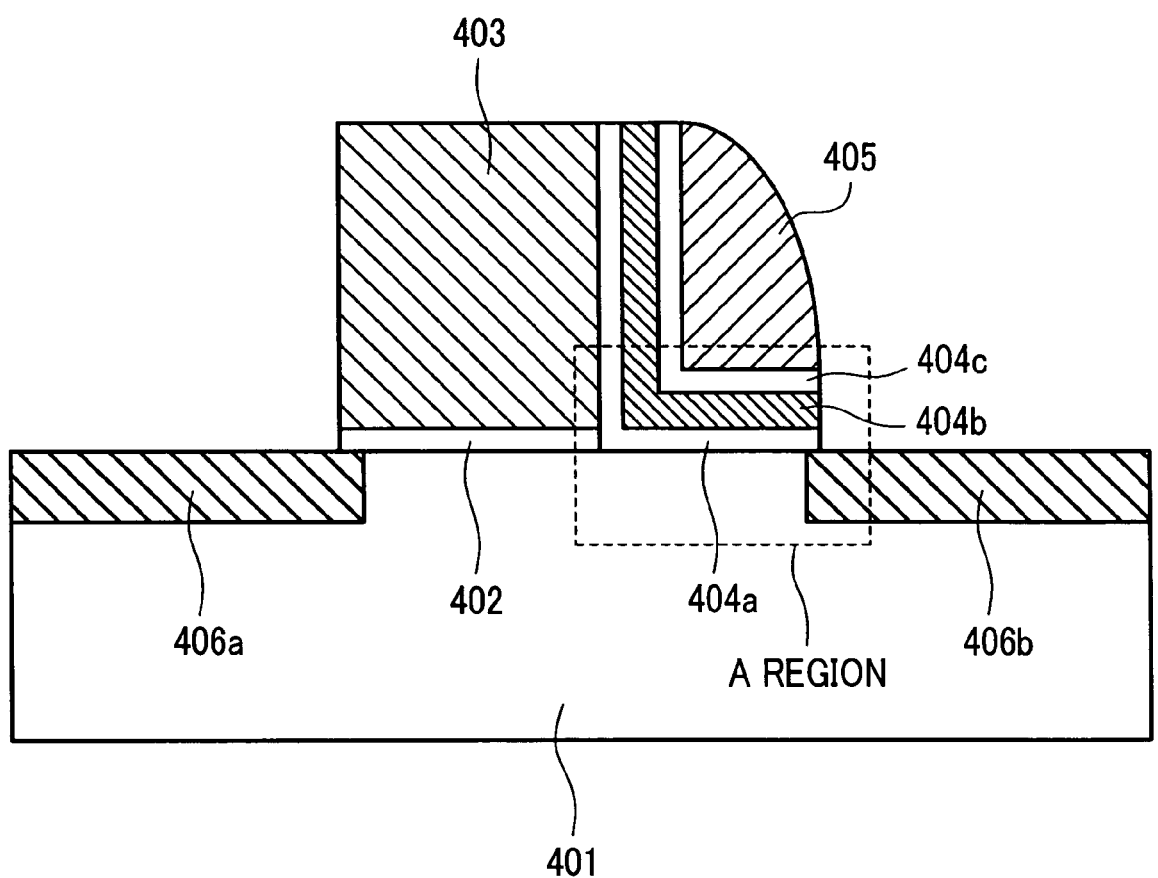
FIG. 15 is a sectional view of a cell showing a conventional split gate structure.
Figure 16:
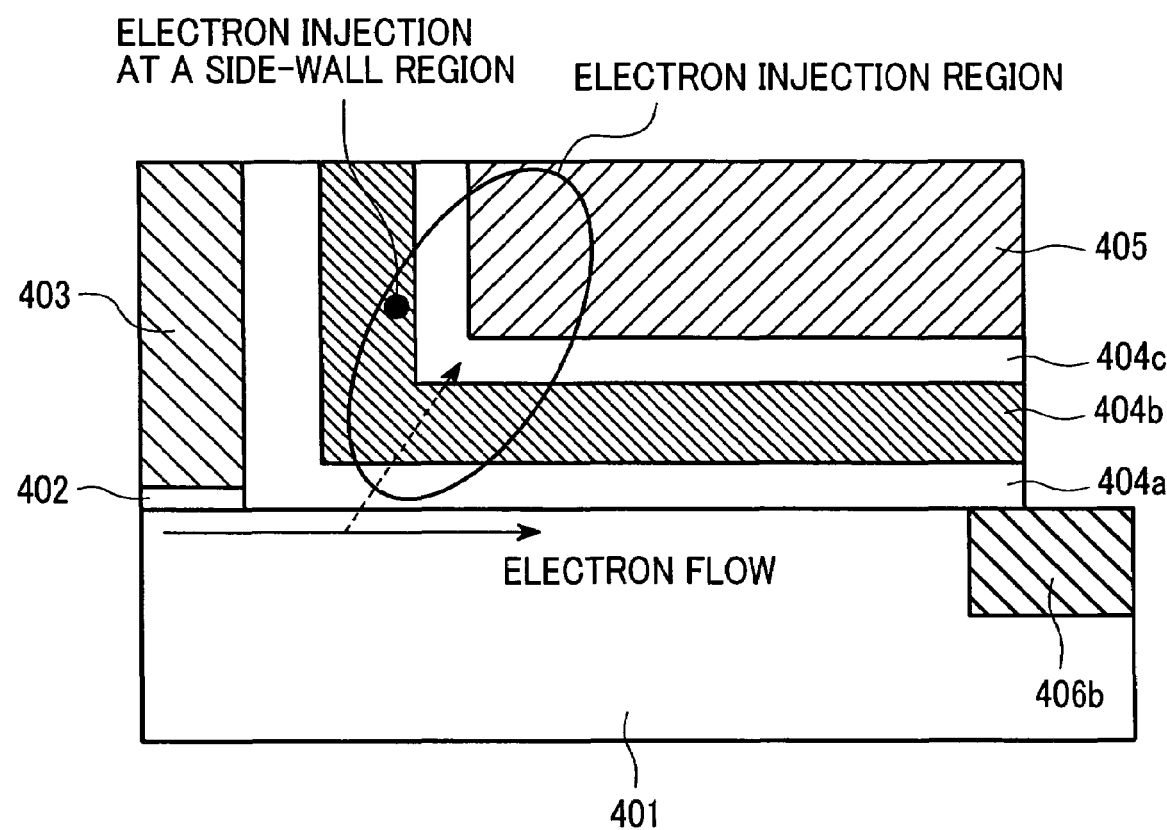
FIG. 16 is a sectional schematic explaining injection of hot electrons (writing) into a conventional cell structure.
Figure 17:
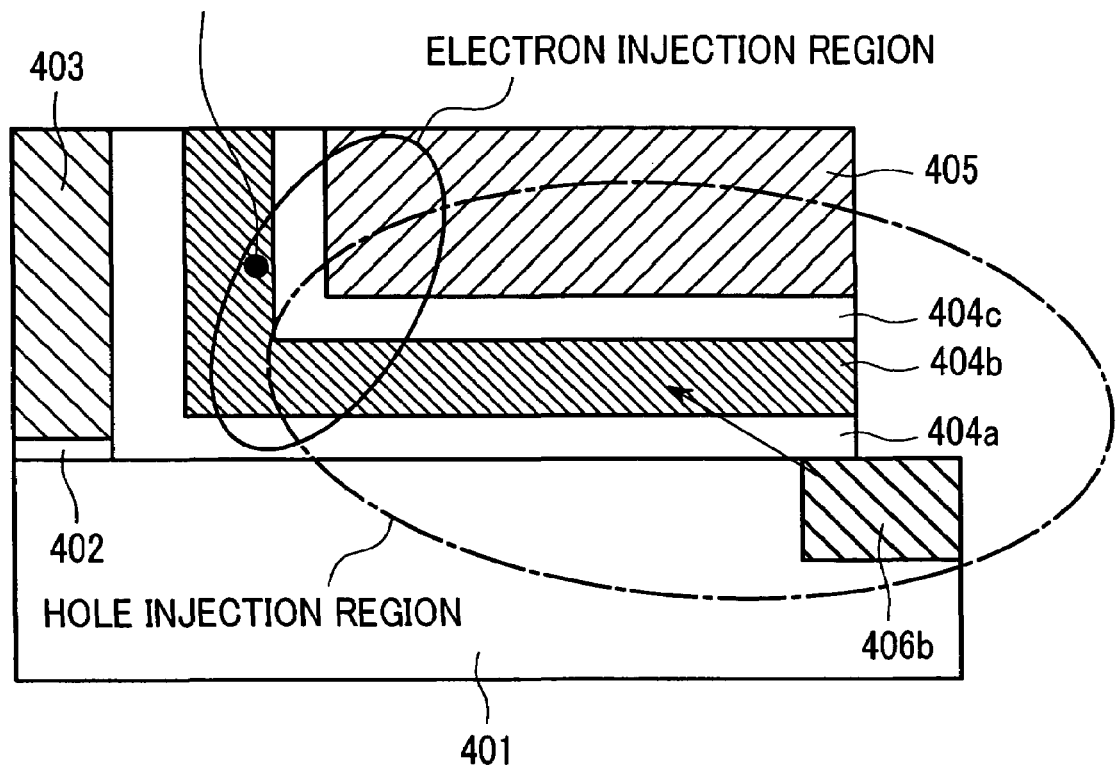
FIG. 17 is a sectional schematic explaining injection of hot holes (erasing) into a conventional cell structure.

Next, the fourth embodiment according to the present invention is explained on the basis of FIG. 14. The present embodiment corresponds to the example of the third configuration outlined earlier on the basis of FIG. 20 and, in the present embodiment too, the structure of the memory array and the setting of each voltage are identical to those in the first embodiment. In the present embodiment, the memory cell shown in FIG. 14 was produced by the method shown in the first embodiment.

In FIG. 14, the reference numeral 301 represents a well region (Si substrate), and 302 and 303 represent the gate insulator film and the gate electrode, respectively, of the select MOS transistor $Q_2$. Meanwhile, the reference numerals 304*a* 304*b* and 304*c* are the gate insulator films 204 of the memory MOS transistor $Q_1$ and represent the bottom Si oxide film, the Si nitride film and the top Si oxide film, respectively. The reference numerals 304'*a*, 304'*b* and 304'*c* are the insulator films that were formed at the same time when the gate insulator film 204 of the memory MOS transistor $Q_1$ was formed and electrically separated the gate electrode 303 of the select MOS transistor from the gate electrode 305 of the memory MOS transistor. The reference numerals 306*a* and 306*b* correspond to the source region and the drain region, respectively, of the MONOS memory.

Difference between the present embodiment (FIG. 14) and the first embodiment is in the method of forming the Si nitride films 304*b* and 304'*b* acting as charge trapping films. In the present embodiment, the low-pressure thermal CVD method was employed for the formation of the Si nitride film. In this case, the Si nitride film was formed by using monosilane ($SiH_4$) and ammonia ($NH_3$) or disilane ($Si_2H_6$) and $NH_3$ as the material gas, though the Si nitride film formed by using either of those material gases was inferior in the step coverage capability to the Si nitride film formed by using dichlorosilane ($SiH_2Cl_2$) and $NH_3$ as the material gas. The conditions for forming each Si nitride film are shown hereunder.

(1) In the case of an Si nitride film formed by using $SiH_2Cl_2$ and $NH_3$ as the material gas, the conditions were temperature: 780° C., pressure: 60 to 200 Pa, $SiH_2Cl_2$ flow rate: 20 cc/min., and $NH_3$ flow rate: 220 cc/min.

(2) In the case of an Si nitride film formed by using $SiH_4$ and $NH_3$ as the material gas, the conditions were temperature: 700° C., pressure: 100 to 400 Pa, $SiH_4$ flow rate: 30 cc/min., and $NH_3$ flow rate: 220 cc/min.

(3) In the case of an Si nitride film formed by using $Si_2H_6$ and $NH_3$ as the material gas, the conditions were temperature: 650° C., pressure: 200 to 400 Pa, $Si_2H_6$ flow rate: 10 cc/min., and $NH_3$ flow rate: 400 cc/min.

The thickness of the Si nitride film 304*b* acting as a charge trapping film was adjusted so that the thickness at the flat portion was 12 nm. In this case, the thicknesses of the Si nitride film 304'*b* deposited on the sidewall of the gate electrode 303 of the select MOS transistor was 12 nm under the condition (1), 8.5 nm (70%) under the condition (2) and 6 nm (50%) under the condition (3). Electrical measurements were carried out by changing the thickness of the Si nitride film 304'*b* deposited on the sidewall of the gate electrode 303 of the select MOS transistor as stated above.

The electric properties of the split gate type MONOS nonvolatile memory produced in the present embodiment were compared with those of a conventional structure under the voltage conditions shown in FIG. 8. As a result, both the retrieving current and writing time of the present embodiment were identical to those of the condition (1). With regard to the erasing time, the condition (3) was the shortest and the condition (2) was the next shortest. It was found by the present embodiment that, as the thickness of the Si nitride film 304'*b* deposited on the sidewall of the gate electrode 303 of the select MOS transistor decreased, the amount of unerased electrons decreased and the erasing current for generating hot holes could be reduced.

Further, with regard to endurance characteristics, in the cases of the conditions (2) and (3), no unerased electrons were observed up to 1e4 times. Furthermore, the status-quo retention property (defined by the variation of threshold voltage) at 150° C. was improved by about one digit in comparison with the conventional structure.

As described above, the present invention established by the present inventors has concretely been explained on the basis of the embodiments. However, it goes without saying that the present invention is not limited to the above embodiments and various modifications are included in the present invention as long as those do not deviate from the gist of the present invention.

In addition, a nonvolatile memory according to the present invention can be mounted on various devices, including the application to a microcomputer. Further, it is applicable to all kinds of nonvolatile semiconductor devices that use insulator films having charge retention function represented by Si nitride films.

What is claimed is:

1. A nonvolatile semiconductor memory device which has memory cells of a split structure, each memory cell comprising:

(a) a first semiconductor region and a second semiconductor region formed in a semiconductor substrate;

(b) a select gate and a memory gate formed after the formation of said select gate, said gates being formed above the portion located between said first and second semiconductor regions of said semiconductor substrate;

(C) a first insulator film formed between said select gate and said semiconductor substrate; and (d) a second insulator film formed between said memory gate and said semiconductor substrate and also on the sidewall of said select gate, said sidewall being located between said select gate and said memory gate, wherein said second insulator film includes a first potential barrier film on said semiconductor substrate, a silicon nitride film formed further thereon, and a second potential barrier film formed yet further thereon and the thickness of the silicon nitride film formed on said select gate sidewall between said select gate and said memory gate is thinner than the thickness of the silicon nitride film formed between said memory gate and said semiconductor substrate.

2. A nonvolatile semiconductor memory device according to claim 1, comprising:
   a writing means to write by injecting electrons into a local region of said silicon nitride film from said semiconductor substrate; and
   an erasing means to erase the electrons injected by said writing means by injecting holes into said local region of said silicon nitride film.

3. A nonvolatile semiconductor memory device according to claim 1, wherein one face of said select gate sidewall has an inversely tapered shape in a cross section thereof.

4. A nonvolatile semiconductor memory device according to claim 3, wherein said one face of said select gate sidewall is the one on the side adjacent to said memory gate; and the angle between the extension of the surface of said select gate sidewall and the surface of said Si substrate is in the range from 75° to 90°.

5. A nonvolatile semiconductor memory device according to claim 1, wherein the thickness of the silicon oxide film acting as said first potential barrier film formed on said one face of said select gate sidewall is reduced at a portion close to said silicon substrate.

6. A nonvolatile semiconductor memory device according to claim 1, wherein an insulator film pattern is formed on said select gate; and the edge of a select gate pattern is located on the inside of one of the edges of said insulator film pattern.

7. A nonvolatile semiconductor memory device according to claim 6, wherein said one face of said select gate sidewall is the one on the side adjacent to said memory gate; and the distance between said edge of said insulator film pattern formed on said select gate and said select gate pattern edge located on the inside of said insulator film pattern edge is 40 nm or less.

* * * * *